US008929638B2

United States Patent
Dempsey et al.

(10) Patent No.: US 8,929,638 B2
(45) Date of Patent: Jan. 6, 2015

(54) CORRECTION OF SATURATION BANDING ARTIFACTS IN MAGNETIC RESONANCE IMAGING

(71) Applicant: ViewRay Incorporated, Oakwood Village, OH (US)

(72) Inventors: James F. Dempsey, Chagrin Falls, OH (US); Roger Nana, Oakwood, OH (US); Tony Apicella, Oakwood, OH (US)

(73) Assignee: ViewRay Incorporated, Oakwood Village, OH (US)

( * ) Notice: Subject to any disclaimer, the term of this patent is extended or adjusted under 35 U.S.C. 154(b) by 0 days.

(21) Appl. No.: 14/082,016

(22) Filed: Nov. 15, 2013

(65) Prior Publication Data
US 2014/0072199 A1   Mar. 13, 2014

Related U.S. Application Data

(62) Division of application No. 13/209,267, filed on Aug. 12, 2011, now Pat. No. 8,639,006.

(60) Provisional application No. 61/373,194, filed on Aug. 12, 2010.

(51) Int. Cl.
*G06K 9/00*      (2006.01)
*G06T 5/00*      (2006.01)
*G01R 33/565*    (2006.01)
*G01R 33/483*    (2006.01)

(52) U.S. Cl.
CPC .............. *G06T 5/002* (2013.01); *G01R 33/565* (2013.01); *G01R 33/4833* (2013.01); *G01R 33/4835* (2013.01)
USPC ......................................................... 382/131

(58) Field of Classification Search
None
See application file for complete search history.

(56) References Cited

U.S. PATENT DOCUMENTS

2011/0288407 A1 * 11/2011 Brinks et al. .................. 600/427

* cited by examiner

*Primary Examiner* — Atiba O Fitzpatrick
(74) *Attorney, Agent, or Firm* — Mintz Levin Cohn Ferris Glovsky and Popeo, P.C.

(57) ABSTRACT

Systems and methods for correcting saturation banding artifacts in magnetic resonance imaging in which artifact and reference calibration scans are used to create one dimensional or two dimensional correction profiles, which are subsequently applied to actual diagnostic imaging scans to correct the saturation banding artifacts.

15 Claims, 25 Drawing Sheets

CORRECTION OF SATURATION BANDING ARTIFACTS IN MAGNETIC RESONANCE IMAGING

RELATED APPLICATION

This application is a divisional of U.S. Application No. 13/209,267, filed Aug. 12, 2011, entitled "Correction of Saturation Banding Artifacts in Magnetic Resonance Imaging", which is hereby incorporated by reference in its entirety.

This application claims the benefit of U.S. Provisional Application No. 61/373,194, filed Aug. 12, 2010, titled "Correction of saturation banding artifacts in rapid multiplanar MRI with intersecting imaging planes," which is hereby incorporated by reference.

TECHNICAL FIELD

The present application relates to systems and methods for magnetic resonance imaging ("MRI") and particularly to the correction of saturation banding artifacts.

BACKGROUND

Magnetic resonance imaging, or nuclear magnetic resonance imaging, is primarily a medical imaging technique used most commonly in radiology to visualize the internal structure and function of the body. MRI is described, for example, by E. MARK HAACKE ET AL., MAGNETIC RESONANCE IMAGING: PHYSICAL PRINCIPLES AND SEQUENCE DESIGN (Wiley-Liss 1999), which is hereby incorporated by reference. Dark saturation band artifacts may appear at the intersection of imaging planes in certain types of MRI scanning, for example, in scans acquired sequentially or in interleaved fashion in rapid multiplanar magnetic resonance imaging. The present disclosure provides systems and methods for correcting such artifacts.

SUMMARY

Systems and methods for correcting saturation banding artifacts in magnetic resonance imaging in which artifact and reference calibration scans are used to create various correction profiles, which are subsequently applied to actual diagnostic imaging scans to correct the saturation banding artifacts.

These and other features, aspects, and advantages of the present disclosure will become better understood with reference to the following description and claims.

BRIEF DESCRIPTION OF THE DRAWINGS

Features, aspects, and embodiments of the disclosure are described in conjunction with the attached drawings, in which.

DETAILED DESCRIPTION

The disclosed systems and methods for the correction of saturation banding artifacts have benefits for applications such as diagnostics and interventional MRI. Examples of diagnostic applications include anatomic localizers, repeated rapid imaging (aka fluoroscopy) for localization and studying movement (e.g., phonation), and imaging freely moving subjects (e.g., fetal MRI). Examples of interventional applications include image guided radiotherapy to track a treated target or to avoid critical structures, pre-stereotactic surgical planning to identify and avoid critical structures, real-time intraprocedural guidance in multiple orthogonal planes, and providing imaging feedback regarding the interventional instrument position. This list is not exhaustive, and the application of this disclosure is understood to apply to all relevant applications of magnetic resonance imaging.

Dark saturated intersection lines or bands may occur in various types of magnetic resonance imaging such as with interleaved or sequential acquisition of non-parallel imaging planes in rapid multiplanar MRI. In this context, rapid imaging typically refers to situations where the time between consecutive radiofrequency (RF) excitation pulses is less than the T1 relaxation of the imaged subject. The characteristics of the saturation bands (darkness and size) are highly dependent on the pulse sequence, the acquisition timing, and the imaged subject. Banding may be useful in some circumstances, such as in characterizing MR systems (e.g., spatial distortions, slice thickness and chemical shift displacement). In addition, the saturated bands may also contain information for a transformation of the gradient coordinate system into the oblique coordinate system of the patient, providing standardized planes to improve image interpretation and quantitative examinations. However, in many diagnostic and interventional applications, these hypointense artifacts can be extremely problematic, as they obscure the underlying anatomy. Potential problems include decreased contrast and signal to noise ratio (SNR) for small anatomic structures, decreased contrast and SNR in areas of pathology, and obfuscation of interventional instruments, such as needles or laser fibers.

Figure 1:
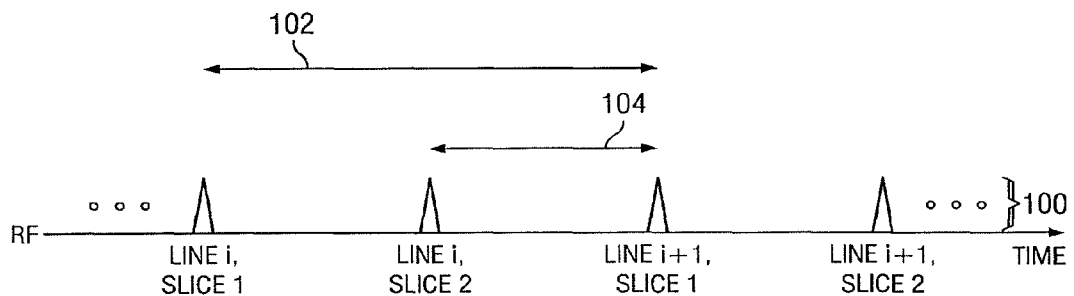
FIG. 1 shows a train of RF excitation pulses played out during a gradient echo acquisition of two slices in an interleaved fashion.
Figure 2:
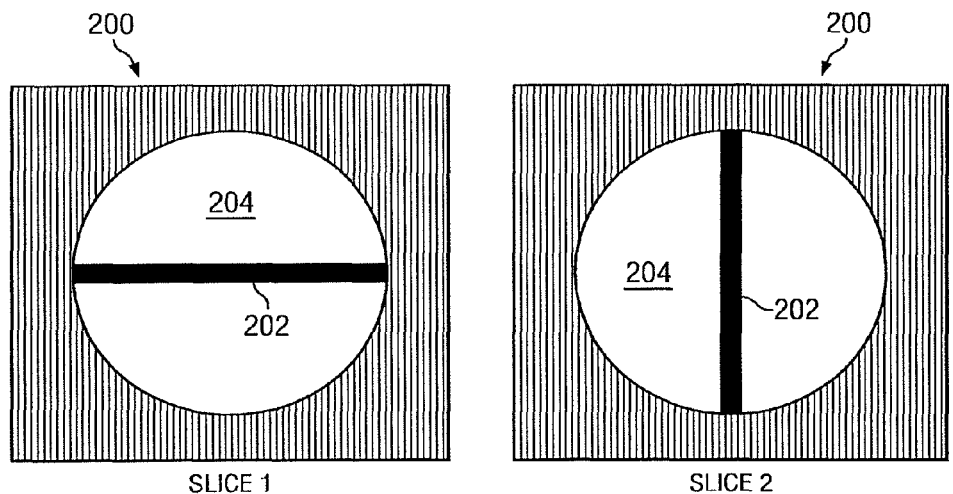
FIG. 2 shows a schematic representation of the saturation bands that would exist in images generated from an experiment utilizing the train of excitation pulses depicted in FIG. 1.

One approach to reducing a saturation band in one of the imaging planes has been to reduce the flip angle during the acquisition of the remaining planes. However, this approach only reduces the artifact in one plane at the expense of reduced signal to noise ratio (SNR) in the remaining planes. Another method of addressing saturation banding artifacts has been to encode the center of k-space lines at the end of the acquisition of each slice. However, this approach alters the image SNR in all planes. Additionally, this approach has only been demonstrated for situations where the planes are acquired sequentially (i.e., all RF excitations of a given slice are played out before the next slice), and the approach may provide different results in interleaved excitation (i.e., a given part of the RF excitations of all slices are acquired first before the next one in the pool). The present disclosure provides systems and methods for correcting saturation banding without degrading the main features of the original image and can be better understood with reference to FIGS. 1 and 2. FIG. 1 depicts a train of RF excitation pulses 100 played out during a gradient echo (GRE) acquisition of two slices in an interleaved fashion. "TR" is a time period 102 between two consecutive RF excitations of the same slice, whereas a time period 104 between two consecutive RF excitations of different slices is TR/2. In a two-intersecting-slice rapid acquisition experiment using a steady state spoiled gradient echo sequence with an interleaved acquisition as shown in FIG. 1, each generated image 200 from the experiment would exhibit a dark saturation band 202 crossing the slice of the subject 204, as illustrated in FIG. 2. Assuming a perfect spoiling, the steady state signal of a region of the slice 204 outside of the saturation band 202 may be given by expression [1] below, for example, according to techniques disclosed by MATT A. BERNSTEIN ET AL., HANDBOOK OF MRI PULSE SEQUENCES (Elsevier Academic Press 2004), which is hereby incorporated by reference.

$$S_A = \frac{M_0 \sin\alpha \left(1 - e^{-\frac{TR}{T1}}\right)}{\left(1 - \cos\alpha\, e^{-\frac{TR}{T1}}\right)} e^{-\frac{TE}{T2}} \quad [1]$$

In expression [1], $M_0$ is the equilibrium longitudinal magnetization, $\alpha$ is the flip angle, TR is the repetition time between two consecutive RF excitations of the same slice, TE is the echo time, and T1 and T2 are relaxation times.

The spins in saturation band 202 experience a train of excitation with a repetition time TR/2. It can be shown that the steady state signal of the spins in saturation band 202 is given by:

$$S_E = \frac{M_0 \sin\alpha \left(1 - e^{-\frac{TR}{2T1}}\right)}{\left(1 - \cos\alpha\, e^{-\frac{TR}{2T1}}\right)} e^{-\frac{TE}{T2}} \quad [2]$$

As the spins in saturation band 202 experience two times the number of excitations of the spins in a region of slice 204 outside of the saturation band 202, it is evident that the signal in saturation band 202 reaches the steady state quicker than that in a region of slice 204 outside of the saturation band 202.

For TR<<T1, a first order approximation of equations 1 & 2 gives:

$$S_A = \frac{M_0 \sin\alpha \left(\frac{TR}{T1}\right)}{\left(1 - \cos\alpha + \cos\alpha\left(\frac{TR}{T1}\right)\right)} e^{-\frac{TE}{T2}} \quad [3]$$

$$S_B = \frac{M_0 \sin\alpha \left(\frac{TR}{2T1}\right)}{\left(1 - \cos\alpha + \cos\alpha\left(\frac{TR}{2T1}\right)\right)} e^{-\frac{TE}{T2}} \quad [4]$$

Rearranging equation 4, $$S_B = \frac{1}{2} \frac{M_0 \sin\alpha \left(\frac{TR}{T1}\right)}{\left(1 - \cos\alpha + \cos\alpha\left(\frac{TR}{T1}\right) - \cos\alpha\left(\frac{TR}{2T1}\right)\right)} e^{-\frac{TE}{T2}} \quad [5]$$

Comparing the denominators of equations 3 and 5 for large flip angles and when TR<<T1, the contrast in the saturation band region 202 is closely similar to that in a region of the slice 204 outside of saturation band 202, although the SNR is lower due to spin saturation. For example, for a large flip angle and a shorter TR, both saturation band region 202 and a region of the slice 204 outside of saturation band 202 have a virtually comparable T1 weighted contrast. In this case, scaling the voxel values in saturation band region 202 with the inverse of the attenuation profile due to saturation would virtually maintain the contrast as if there were no saturation, although there will be a lower SNR in saturation band region 202.

Figure 3:
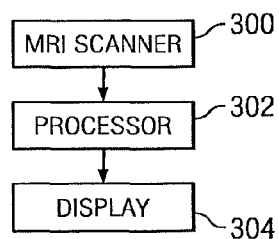
FIG. 3 shows a simplified system diagram for some embodiments of the present disclosure.

As shown in FIG. 3, some embodiments of the present disclosure include an MRI scanner 300 operable to acquire scans, a processor 302 in communication with the MRI scanner 300 and operable to perform various data transformations, and a display 304 operable to receive image data from the processor 302 and to display images to a viewer. In an exemplary embodiment, the MRI scanner 300 may be used to acquire calibration, reference and diagnostic scans, the processor 302 may be used to calculate signal correction profiles and corrected diagnostic images, and display 304 may be used to display any of the acquired or corrected images.

Figure 4:
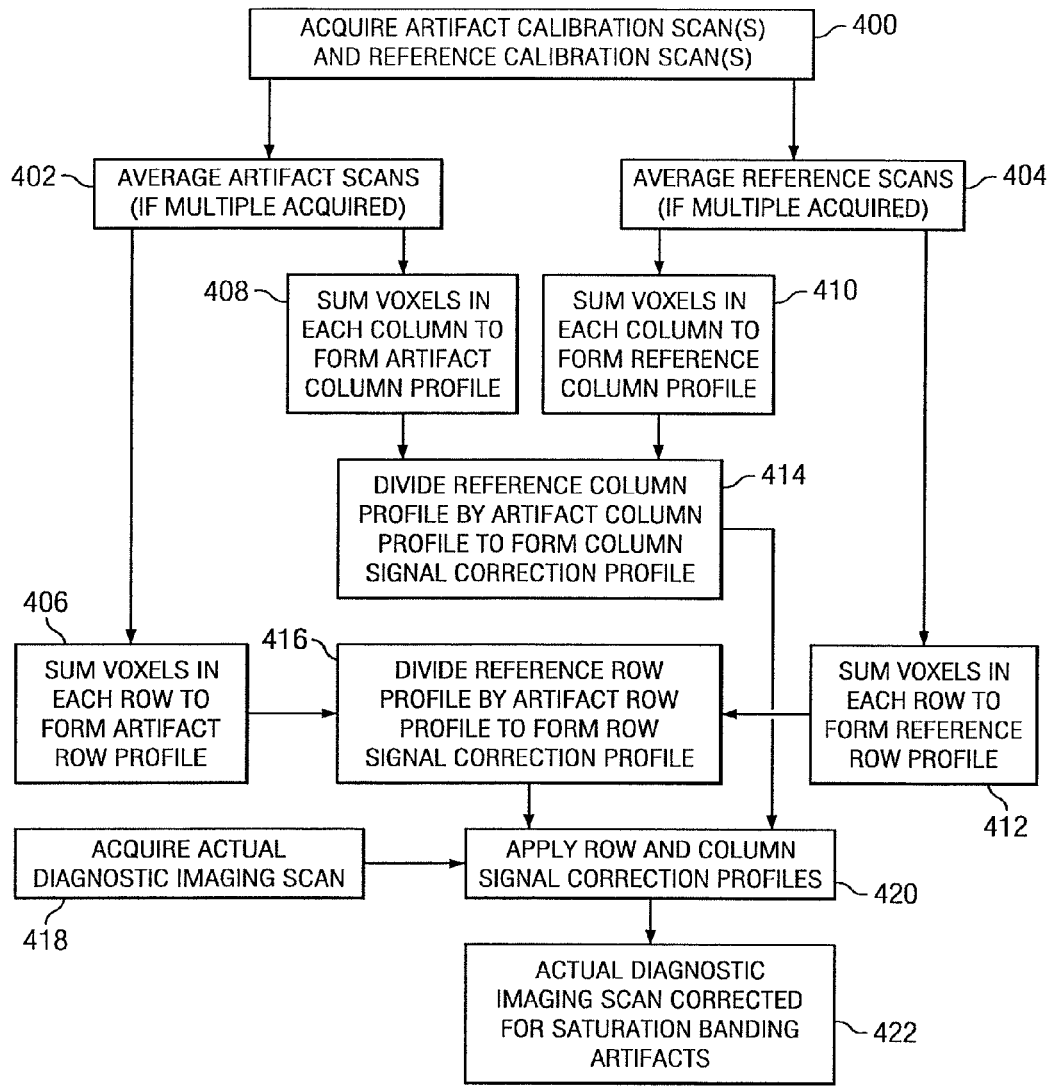
FIG. 4 shows the correction of saturation banding artifacts through the use of one dimensional signal correction profiles.

In one embodiment, saturation banding artifacts may be corrected through the use of one dimensional signal correction profiles as shown in FIG. 4. Correction may begin with the acquisition of at least one artifact calibration scan and at least one reference calibration scan as shown in step 400, although the systems and methods of the present disclosure contemplate performing the calibration scans before, in conjunction with, or after the taking of the actual diagnostic images. If the calibration scans are taken in conjunction with the actual diagnostic imaging, it may be desirable to exclude data containing any influence from a different preceding scan.

Figure 5:
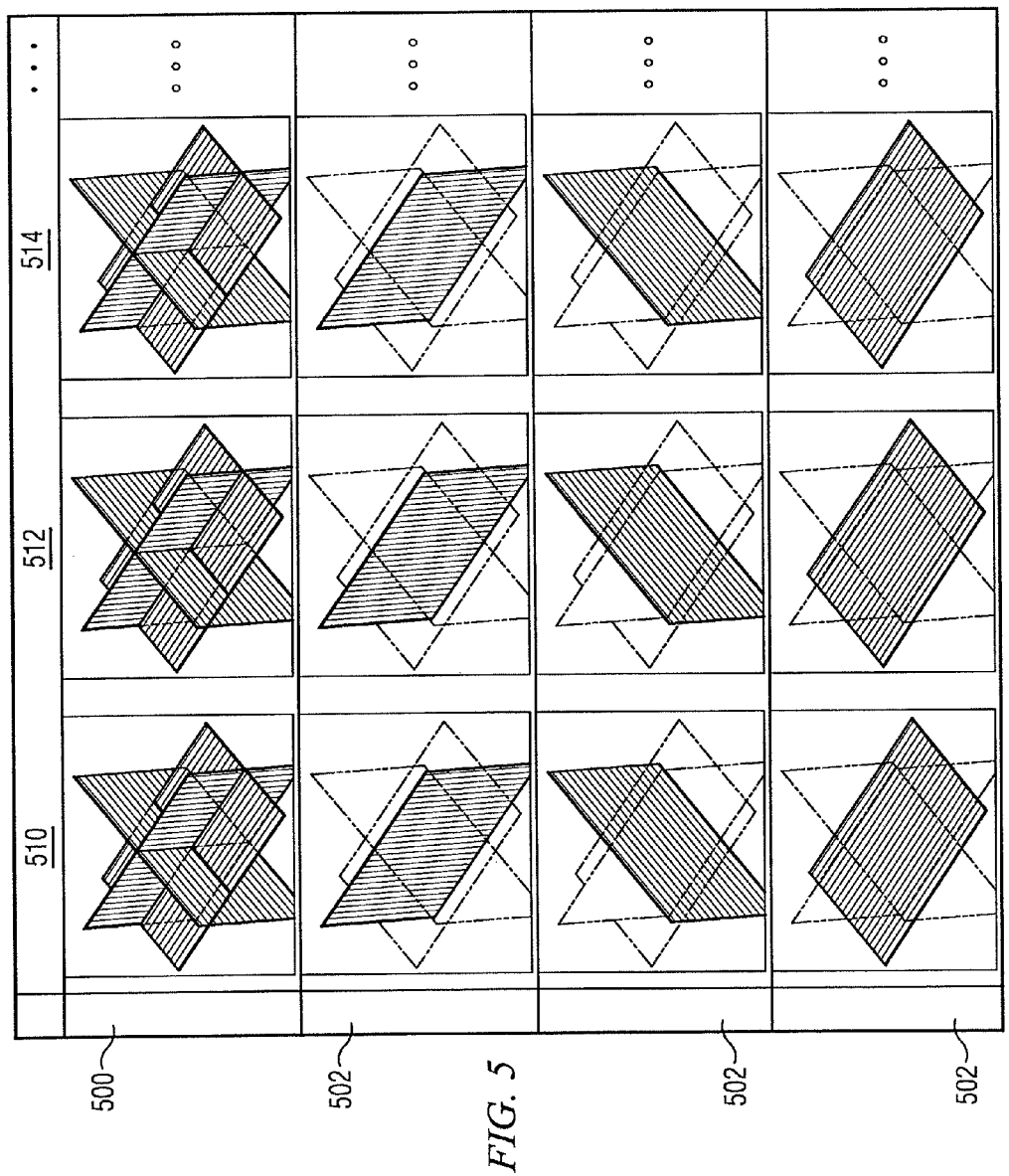
FIG. 5 shows an example of a calibration scan setup.
Figure 6:
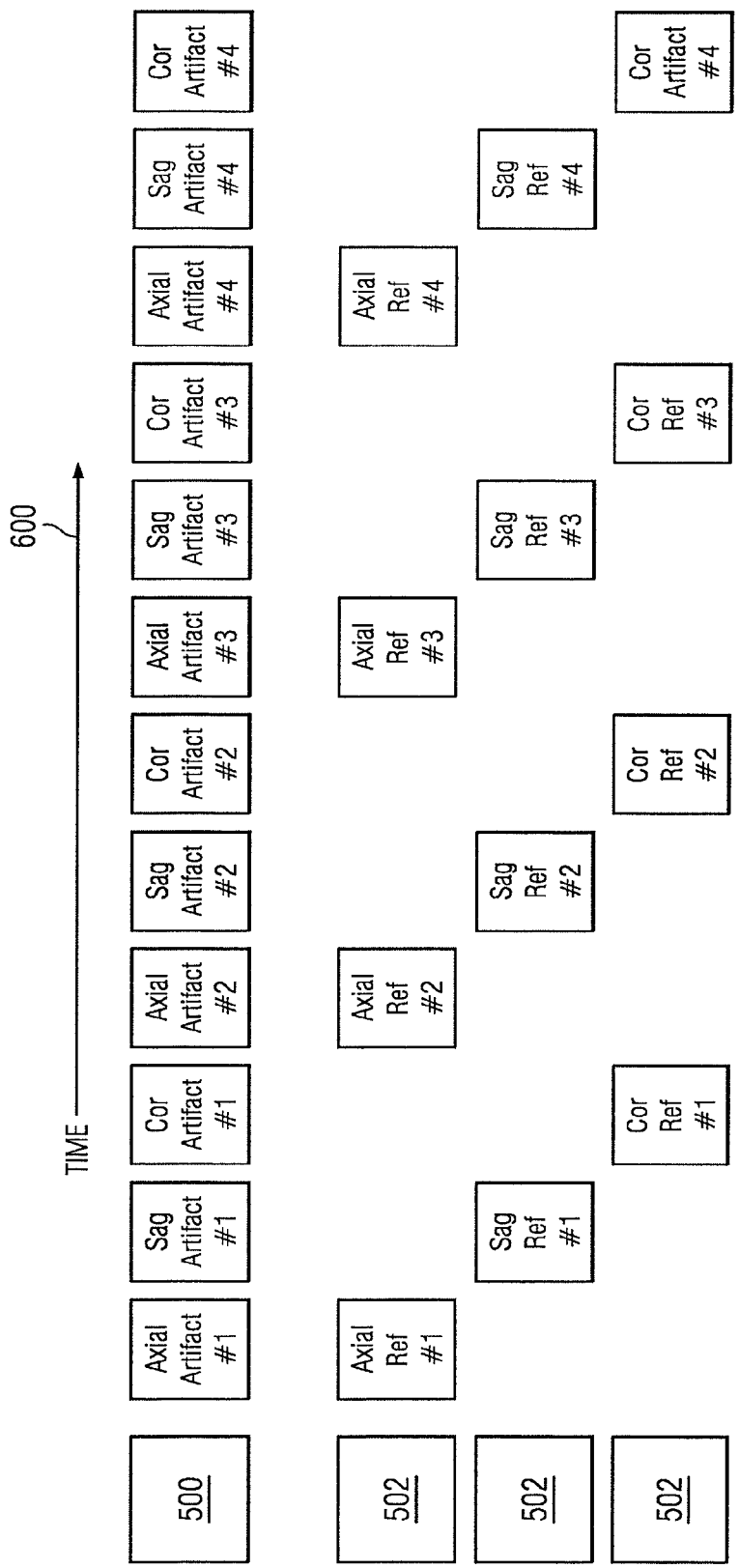
FIG. 6 shows additional detail of an exemplary calibration scan setup as shown in FIG. 5.

One potential embodiment for the acquisition of calibration scans is shown in further detail in FIG. 5, where the calibration scans are set up for the acquisition of three orthogonal slices. Groups of four scans may be desirable for generating the datasets used to estimate the signal correction profiles. The artifact calibration scan 500 acquires, in this embodiment, three orthogonal slices with a timing that corresponds to that of the actual diagnostic imaging scan. The remaining reference calibration scans 502 acquire, in this example, a one slice image of one of the three orientations alone, with the same diagnostic timing. In some embodiments, each scan may include multiple measurements 510, 512, 514, etc., to improve the signal to noise ratio through averaging. This calibration scan setup can be generalized to N intersecting imaging planes for which N+1 groups of scans may be preferable for generating the desired calibration datasets. FIG. 6 further illustrates an example calibration set up in which an artifact scan 500 including three orthogonal slices is acquired in an interleaved fashion, and single slice reference scans 502 (axial, sagittal and coronal) are acquired alone. FIG. 6 shows the timing of the scans relative to one another over the time axis 600. The boxes in FIG. 6 may represent the acquisition of one single k-space line (e.g., a sequence with the acquisition of one line per RF excitation), a group of k-space lines (e.g., a sequence with the acquisition of multiple lines per RF excitation), all k-space lines (e.g., single shot sequences), or any other arrangement that would generate saturation banding.

Figure 7:
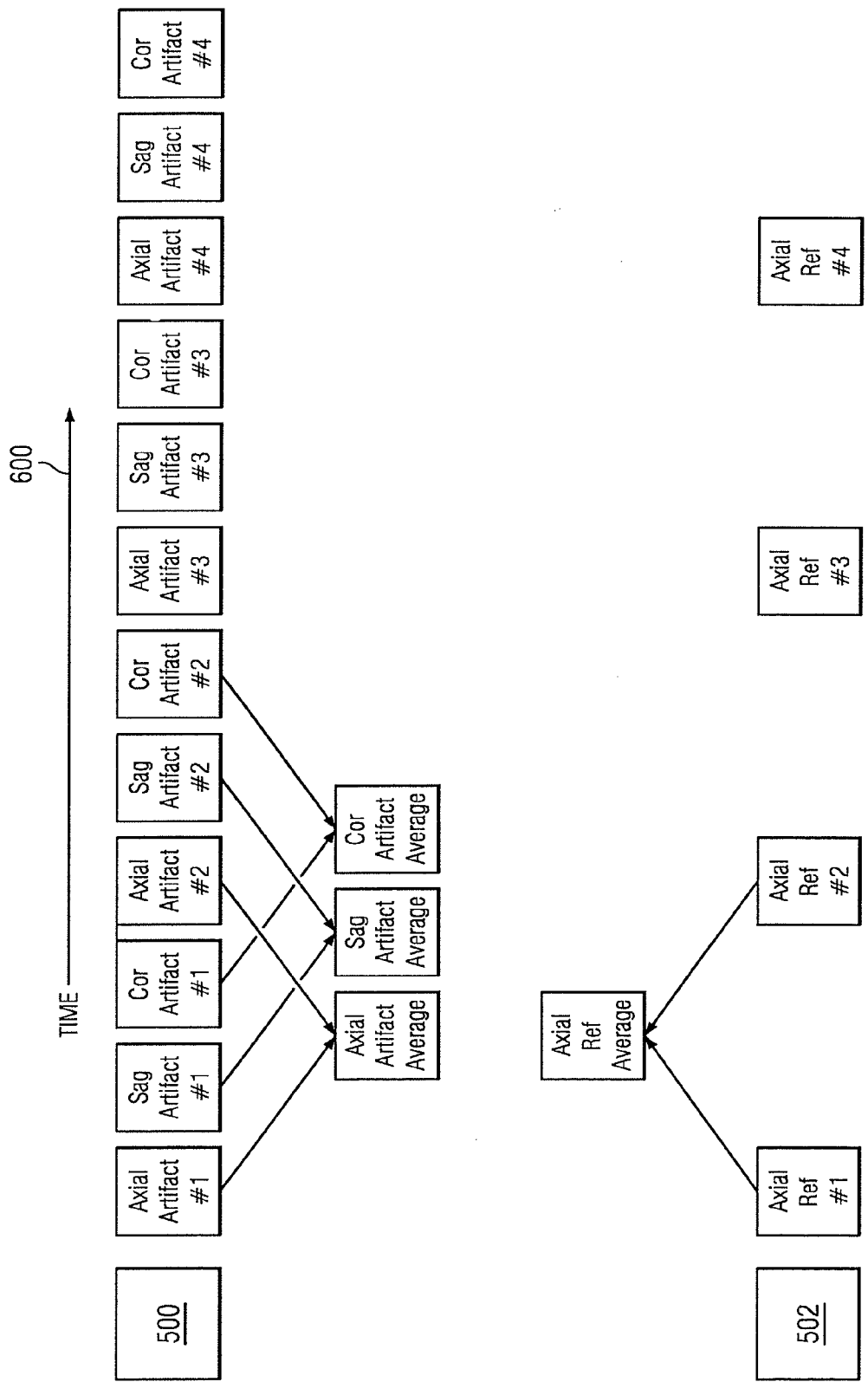
FIG. 7 shows an exemplary method for averaging artifact and reference calibration scans.

FIG. 7 shows, in greater detail, steps 402 and 404 of FIG. 4, wherein averaging of the artifact calibration scans 500 and the reference calibration scans 502 is performed if multiple scans of each type are acquired during step 400. In an exemplary embodiment, averaging in the manner demonstrated in FIG. 7 can improve the signal to noise ratio of the resulting artifact and reference calibration scans. The artifact calibration scan 500 and the reference calibration scan 502 can be normalized at this point with their respective mean intensities, prior to computation of the correction profiles.

Figure 8:
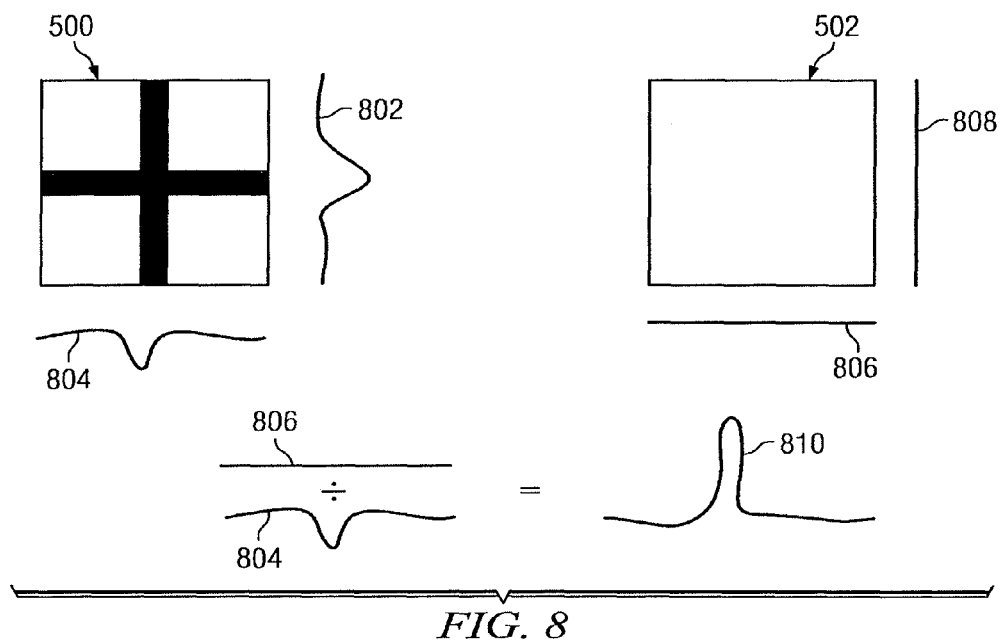
FIG. 8 shows simplified graphical representations of an example of the steps that may be used to calculate artifact and reference row and column profiles and a column signal correction profile.

As shown in FIGS. 4 and 8, the steps in determining the correction profiles 406 and 408 may entail summing the voxels in each row of the artifact calibration scan 500 to create an artifact row profile 802, and summing the voxels in each column of the artifact calibration scan 500 to create an artifact column profile 804. Likewise, in this embodiment, steps 410 and 412 may entail summing the voxels in each column of the reference calibration scan 502 to create a corresponding reference column profile 806, and summing the voxels in each row of the reference calibration scan 502 to create a corresponding reference row profile 808. The top half of FIG. 8 depicts the results of steps 406, 408, 410 and 412 showing the artifact row profile 802, the artifact column profile 804, the reference column profile 806 and the reference row profile 808.

After determining the artifact column profile 804 and the reference column profile 806, the column signal correction profile 810 can be calculated by dividing the reference column profile 806 by the artifact column profile 804. Likewise, the row signal correction profile 812 (not shown in FIG. 8) can be calculated by dividing the reference row profile 808 by the artifact row profile 802.

Figure 9:
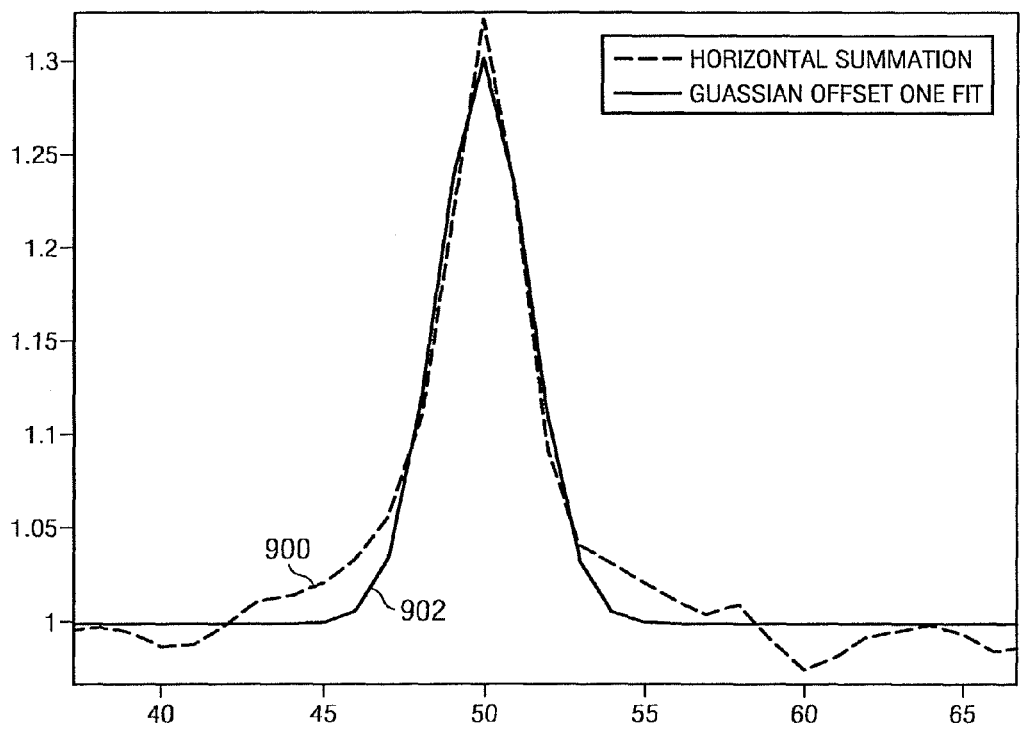
FIG. 9 shows an example of an application of a Gaussian fit to a signal correction profile, with an offset of substantially 1.0.

The row and column signal correction profiles may be noisy, but will be close to one in rows far from the artifact, reaching a large peak in the few rows where the artifact occurs. An example of this is shown as the Horizontal Summation 900 in FIG. 9. In one embodiment of the present disclosure, a Gaussian fit may be applied to the row and column signal correction profiles, with an offset of substantially 1.0. The offset is desirable, because otherwise the fitted function would have values of zero outside the artifact region. The error of the fit can be computed by $$y_e = \left[ y_{cf} - \left\{ \frac{A \exp(-(y_0 - \mu))^2}{\sigma^2} + 1 \right\} \right]^2 \quad [6]$$

where $y_e$, is the error between the fit and the data, A is the amplitude of the Gaussian, It is the mean of the Gaussian, σ is the variance of the Gaussian, $y_{cf}$ are the fitted values at this iteration. The initial estimates to the Gaussian fit may use the largest value of the function minus one as the amplitude of the Gaussian, location of the largest value of the function as the center of the Gaussian, and the variance initialized to 0.25. The fit may be accomplished by an unconstrained nonlinear optimization using a derivative free method. An example of such a fit is depicted as Gaussian Offset One Fit 902 in FIG. 9.

Referring back to the embodiment of FIG. 4, an actual diagnostic imaging scan acquired in step 418 may be corrected for saturation banding artifacts with the one dimensional signal correction profiles by applying the row and column signal correction profiles 810 and 812 to the actual diagnostic imaging scan. This application may be performed by multiplying each of the voxels in each column of the actual diagnostic imaging scan by a corresponding value of the column signal correction profile 810, to obtain a partially corrected diagnostic image, and then multiplying each of the voxels in each row of the partially corrected diagnostic image by a corresponding value of the row signal correction profile 812, to obtain a fully corrected diagnostic image. Likewise, the application may be performed in the reverse order, by multiplying each of the voxels in each row of the actual diagnostic imaging scan by a corresponding value of the row signal correction profile 812, to obtain a partially corrected diagnostic image, and multiplying each of the voxels in each column of the partially corrected diagnostic image by a corresponding value of the column signal correction profile 810, to obtain a fully corrected diagnostic image.

Figure 10:
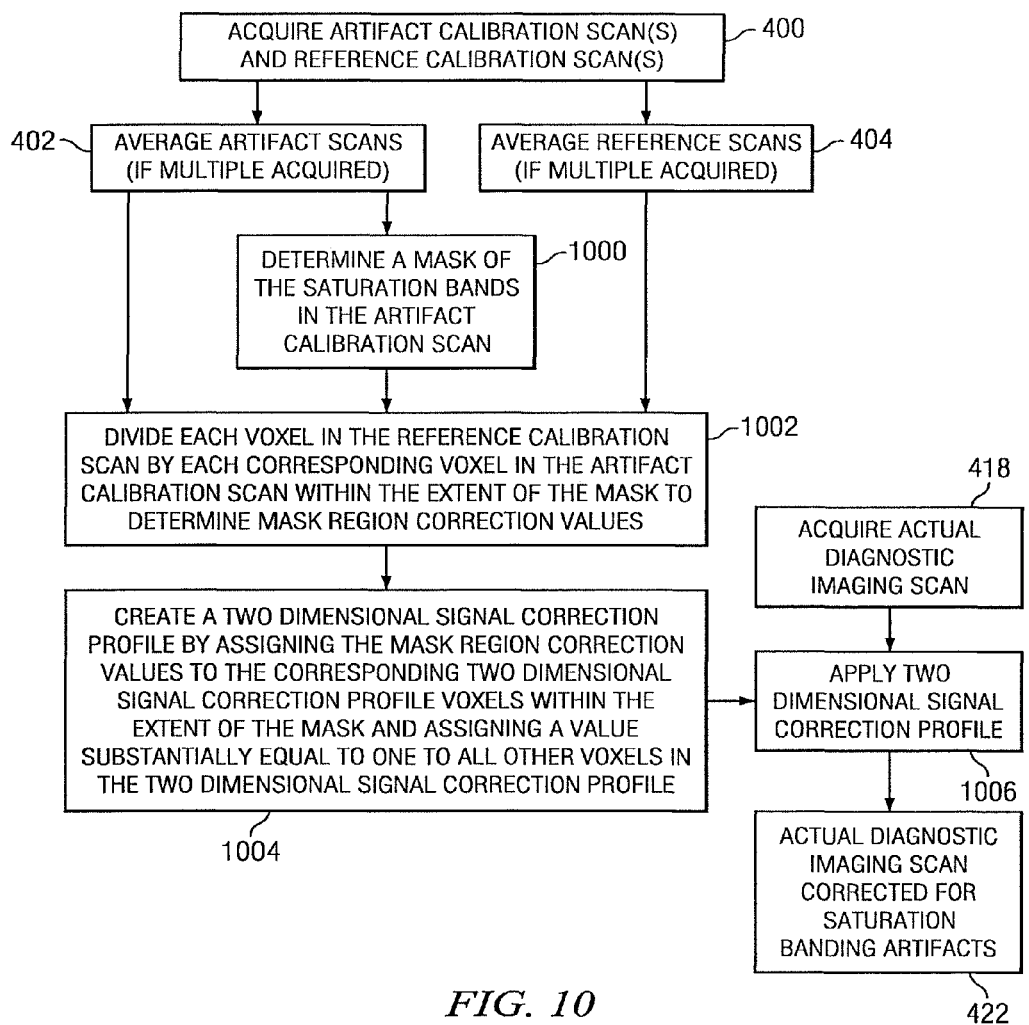
FIG. 10 shows an embodiment of the correction of saturation banding artifacts through the use of two dimensional signal correction profiles.

Another embodiment for the correction of saturation banding artifacts of the present disclosure is shown in FIG. 10, utilizing a two dimensional signal correction profile. Correction using a two dimensional profile may provide superior performance in some embodiments as it can manage non-straight dark banding that may come from deviations of the slice profile due to gradient non-linearity. The initial steps are the same as steps 400, 402 and 404 of the one dimensional signal correction profiles, and the artifact calibration scan(s) 500 and the reference calibration scan(s) 502 can similarly be normalized with their respective mean intensities, prior to computation of the correction profiles.

Figure 11:
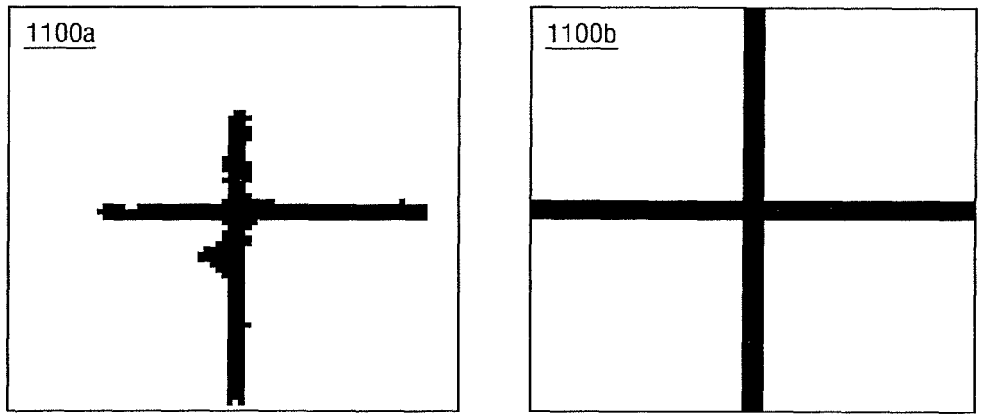
FIG. 11 shows two different types of masks that may be used in certain embodiments for determining two dimensional signal correction profiles.

In some embodiments, step 1000 includes the determination of a mask of the saturation bands in the artifact calibration scan 500. FIG. 11 depicts two different exemplary types of masks, 1100a and 1100b, that may be used. Mask 1100a may be created using a segmentation algorithm on the artifact calibration scan 500. Mask 1100b may be created using available information on the physical locations of the acquired slices and then selecting a band thickness about those locations at least as great as the thickness of a slice and preferably at least four times the thickness of a slice to account for imperfection in the slice profile.

After mask 1100 is determined, the mask region correction values may be determined by dividing each voxel in the reference calibration scan 502 by each corresponding voxel in the artifact calibration scan 500 within the extent of the mask 1100 (step 1002 in FIG. 10). The two dimensional signal correction profile may be created by assigning the mask region correction values to the corresponding two dimensional signal correction profile voxels within the extent of the mask, and assigning a preselected constant value to all other voxels in the two dimensional signal correction profile (step 1004 in FIG. 10). In one embodiment, the preselected constant value may be substantially equal to one.

An actual diagnostic imaging scan acquired in step 418 may be corrected for saturation banding artifacts by applying the two dimensional signal correction profile (step 1006 in FIG. 10). This application may be performed by multiplying each of the voxels in the actual diagnostic imaging scan by the corresponding value in the two dimensional signal correction profile to obtain a fully corrected diagnostic image. In another embodiment, a preselected constant value is not assigned to the two dimensional signal correction profile outside of the mask region, and the multiplication of the voxels in the actual diagnostic imaging scan is only performed within the mask region of the diagnostic scan.

Figure 12:
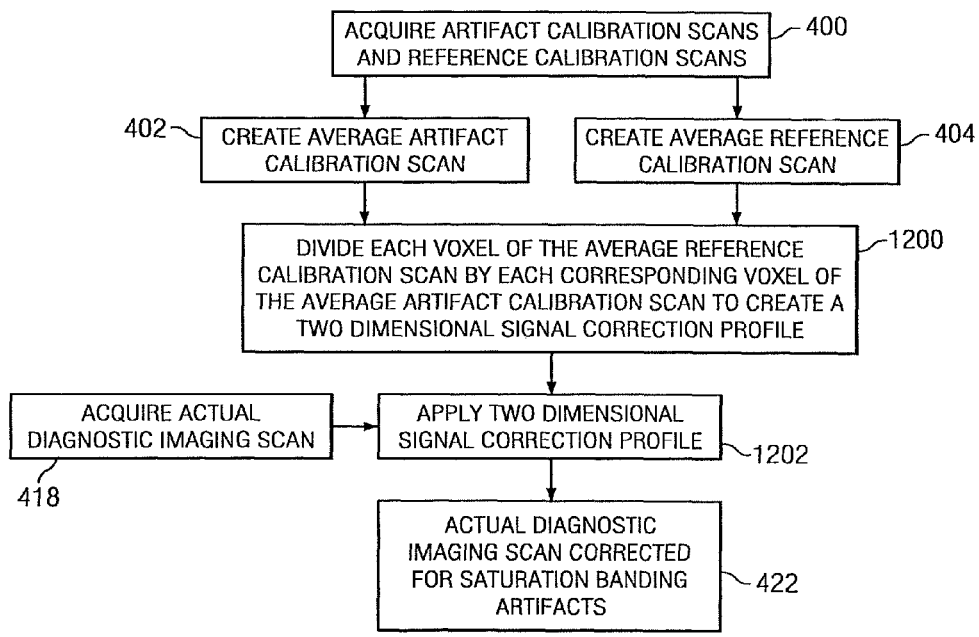
FIG. 12 shows an alternative embodiment of the correction of saturation banding artifacts through the use of two dimensional signal correction profiles.

Another embodiment for the correction of saturation banding artifacts of the present disclosure is shown in FIG. 12, also utilizing a two dimensional signal correction profile, but without the use of a mask. The initial steps are the same as steps 400, 402 and 404 of the previous correction embodiments, and the artifact calibration scan 500 and the reference calibration scan 502 can similarly be normalized with their respective mean intensities, prior to computation of the correction profiles. However, it may be preferable in this embodiment to acquire more than one artifact calibration scan and more than one reference calibration scan and create an average artifact calibration scan and an average reference calibration scan. In the embodiment of FIG. 11, the two dimensional signal correction profile is created by dividing each voxel of the average reference calibration scan by each corresponding voxel of the average artifact calibration scan (step 1200 in FIG. 12).

An actual diagnostic imaging scan acquired in step 418 may be corrected for saturation banding artifacts by applying the two dimensional signal correction profile (step 1202 in FIG. 12). This application may be performed by multiplying each of the voxels in the actual diagnostic imaging scan by the corresponding value in the two dimensional signal correction profile to obtain a corrected diagnostic image.

One aspect of the present disclosure provides a basis for band saturation correction using a two-intersecting-slice rapid acquisition and assuming a steady state spoiled gradient echo (GRE) sequence. However, it should be recognized that the contrast mechanism in the saturation bands becomes complex as the number of intersecting planes increases. For the case of three intersecting imaging planes, each image would have two crossed saturation bands. The spins at the intersection of the crossing bands experience RF excitations with a TR/3 and virtually keep the contrast of the non-saturated spins as per the approximation made above (TR<<T1). Those in the leaves of the crossed bands would experience a variable TR excitation with a pattern TR/3 and 2TR/3 per TR. Nevertheless, the results presented in this disclosure indicate the recovered spins present a contrast that closely resembles that of the non-saturated spins. In general, the saturation band correction of the present disclosure can be applied to any sequence.

FIGS. 13 through 29 present further results of the saturation band correction embodiments of the present disclosure, with FIGS. 13 through 23 demonstrating exemplary embodiments of correction with two dimensional profiles and FIGS. 24 through 29 demonstrating exemplary embodiments of correction with one dimensional profiles. Two MRI pulse sequences that include GRE and Segmented EPI were used to generate the data used in this disclosure. The sequence parameters were set for rapid scans. Two anatomical sites were considered that include head and pelvic. In each scan, multiple measurements were acquired. A first set of measurements were used for calibration and the profiles generated from the calibration data were used to correct the artifacts on the images of the remaining measurements. The correction algorithm was implemented in Matlab.

Figure 13:
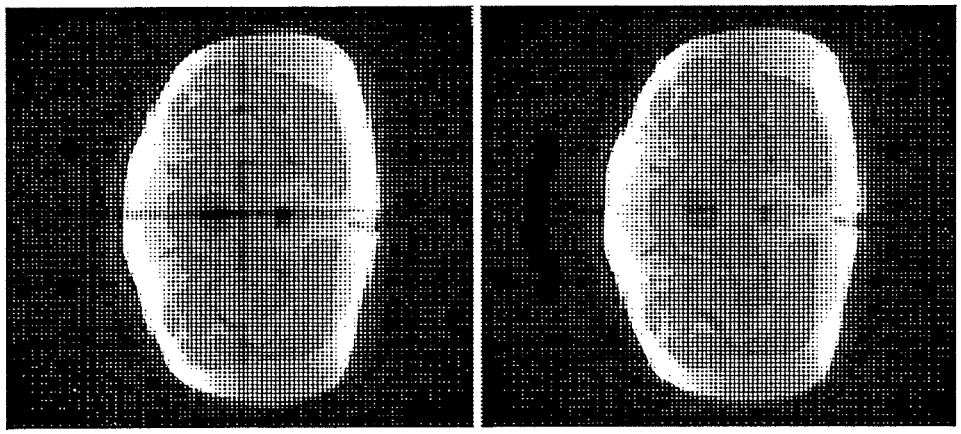
FIG. 13 shows example images demonstrating the correction of saturation banding artifacts using a two dimensional signal correction profile of the present disclosure.
Figure 13:
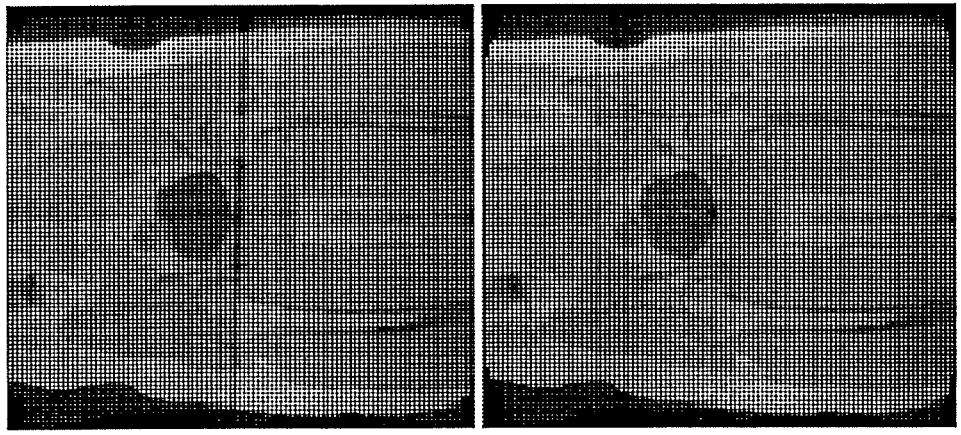
Figure 13:
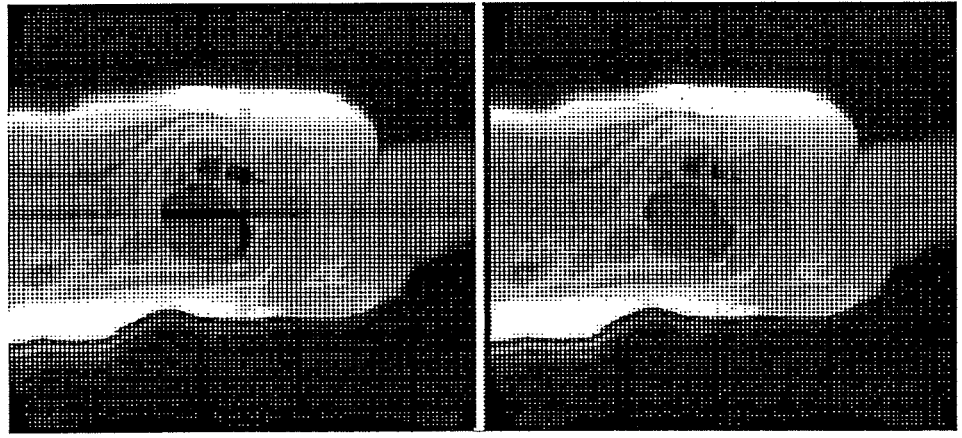
Figure 14:
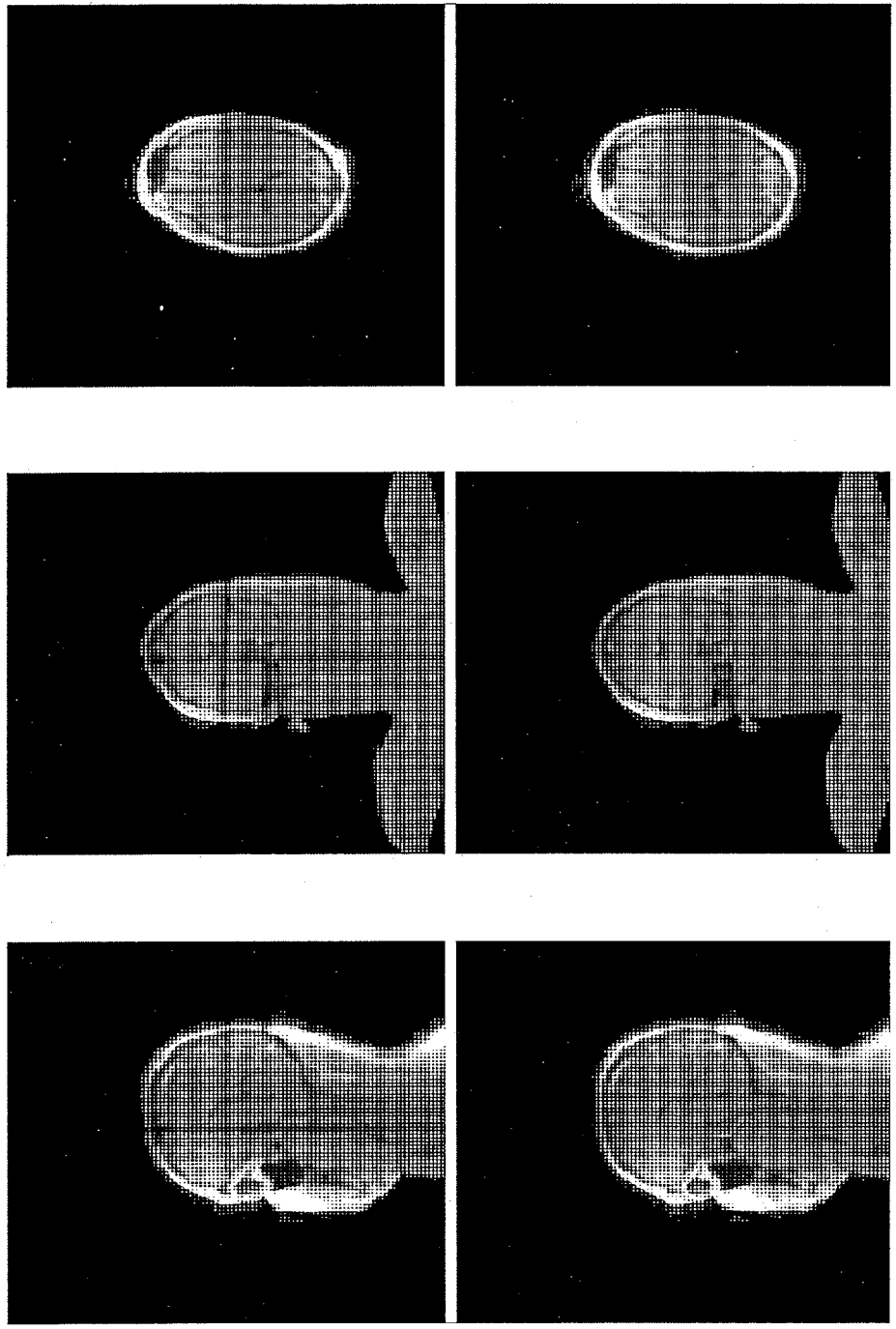
FIG. 14 shows example images demonstrating the correction of saturation banding artifacts using a two dimensional signal correction profile of the present disclosure.

FIGS. 13 and 14 show examples of saturation banding correction using a two dimensional signal correction profile on three orthogonal slices of pelvic and head images acquired using a typical anatomic localizer GRE sequence. In this case, two measurements were performed for each scan (artifact and reference image). The two dimensional profile was estimated from the first measurement and the correction was applied on the images of the second measurement.

FIG. 13 is an example of saturation band correction processed for 0.35 T MR of three orthogonal slices of the pelvic region acquired using an anatomical localizer GRE sequence. Slice thickness and FOV are 5 mm and 420×420 mm, respectively. The top row indicates images with saturation banding artifacts, and the bottom row indicates the corresponding corrected images using a two dimensional signal correction profile. Columns from left to right correspond to sagittal, coronal, and axial views, respectively.

FIG. 14 is an example of saturation band correction processed for 0.35 T MR of three orthogonal slices of the head acquired using an anatomical localizer GRE sequence. Slice thickness and FOV are 5 mm and 420×420 mm, respectively. The top row indicates images with saturation banding artifacts, and the bottom row indicates the corresponding corrected using a two dimensional signal correction profile. Columns from left to right correspond to sagittal, coronal, and axial views, respectively.

Figure 15:
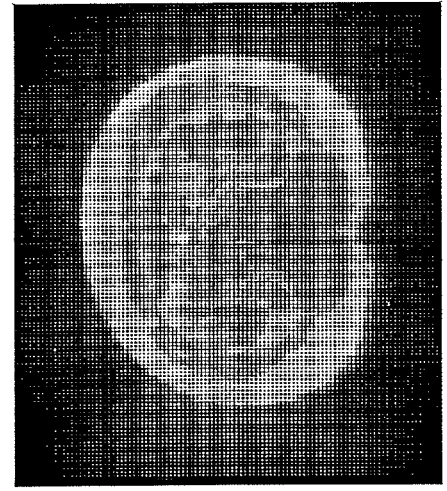
FIG. 15 shows example images demonstrating the correction of saturation banding artifacts using a two dimensional signal correction profile of the present disclosure.
Figure 15:
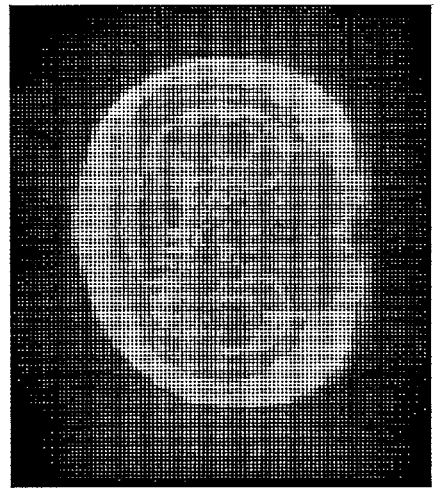
Figure 15:
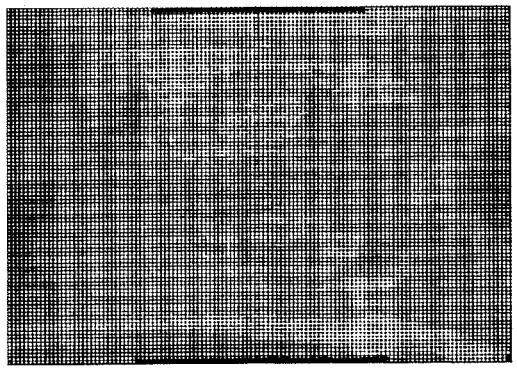
Figure 15:
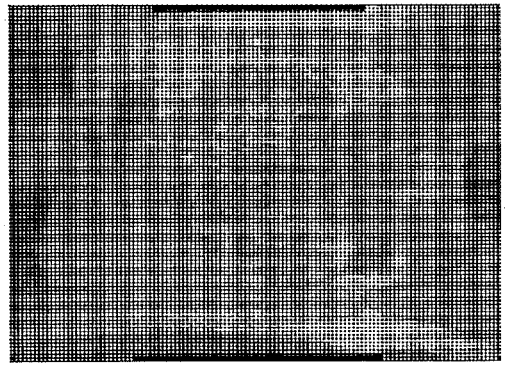
Figure 15:
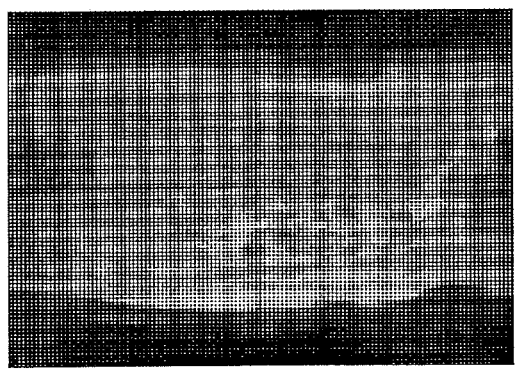
Figure 15:
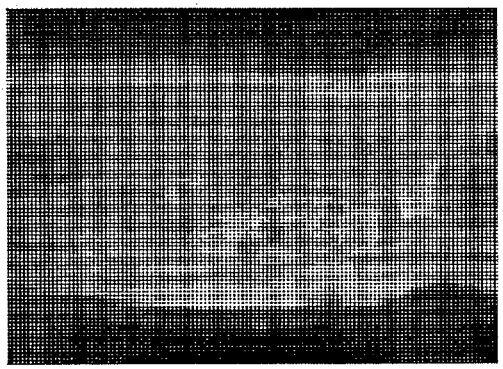
Figure 16:
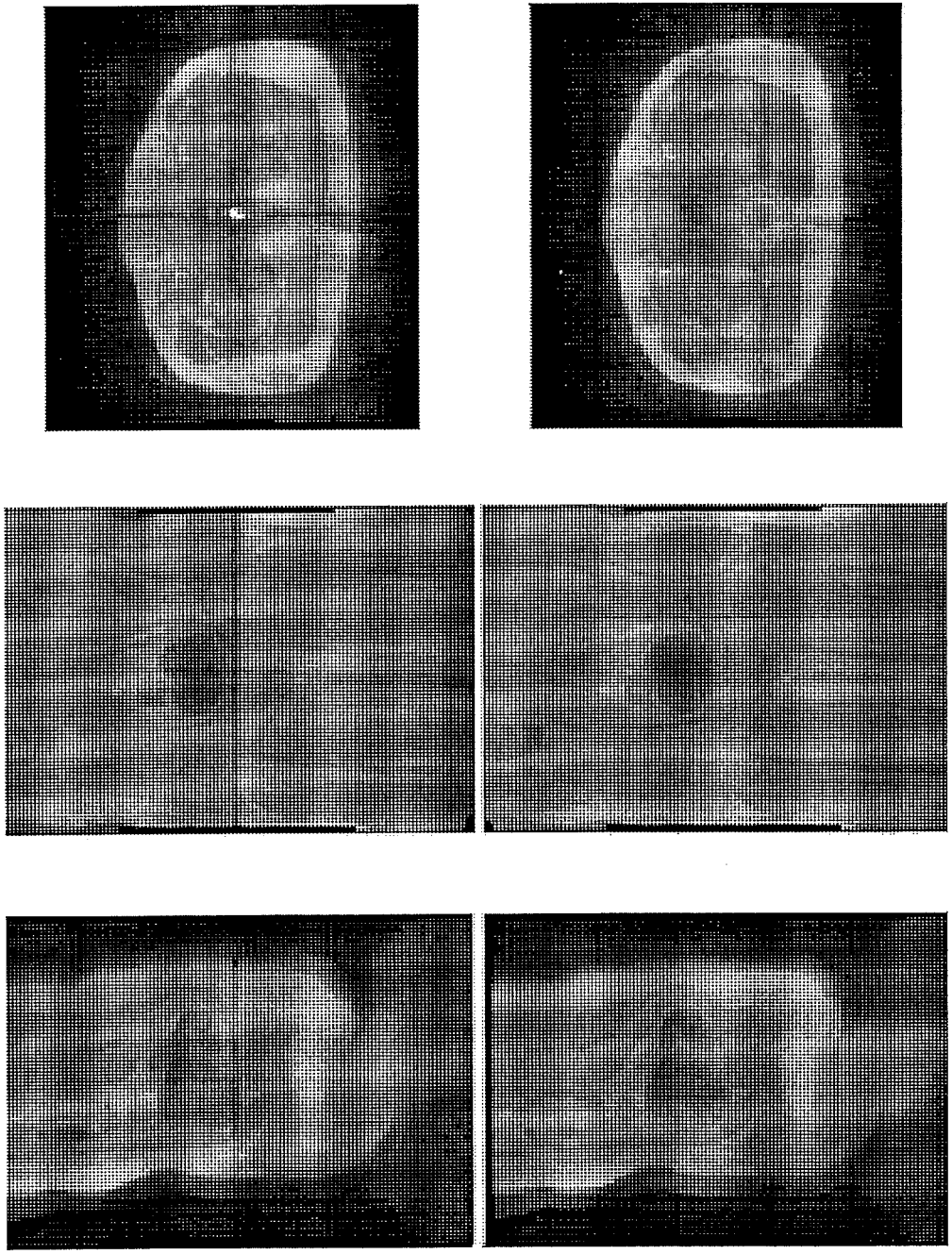
FIG. 16 shows example images demonstrating the correction of saturation banding artifacts using a two dimensional signal correction profile of the present disclosure.
Figure 17:
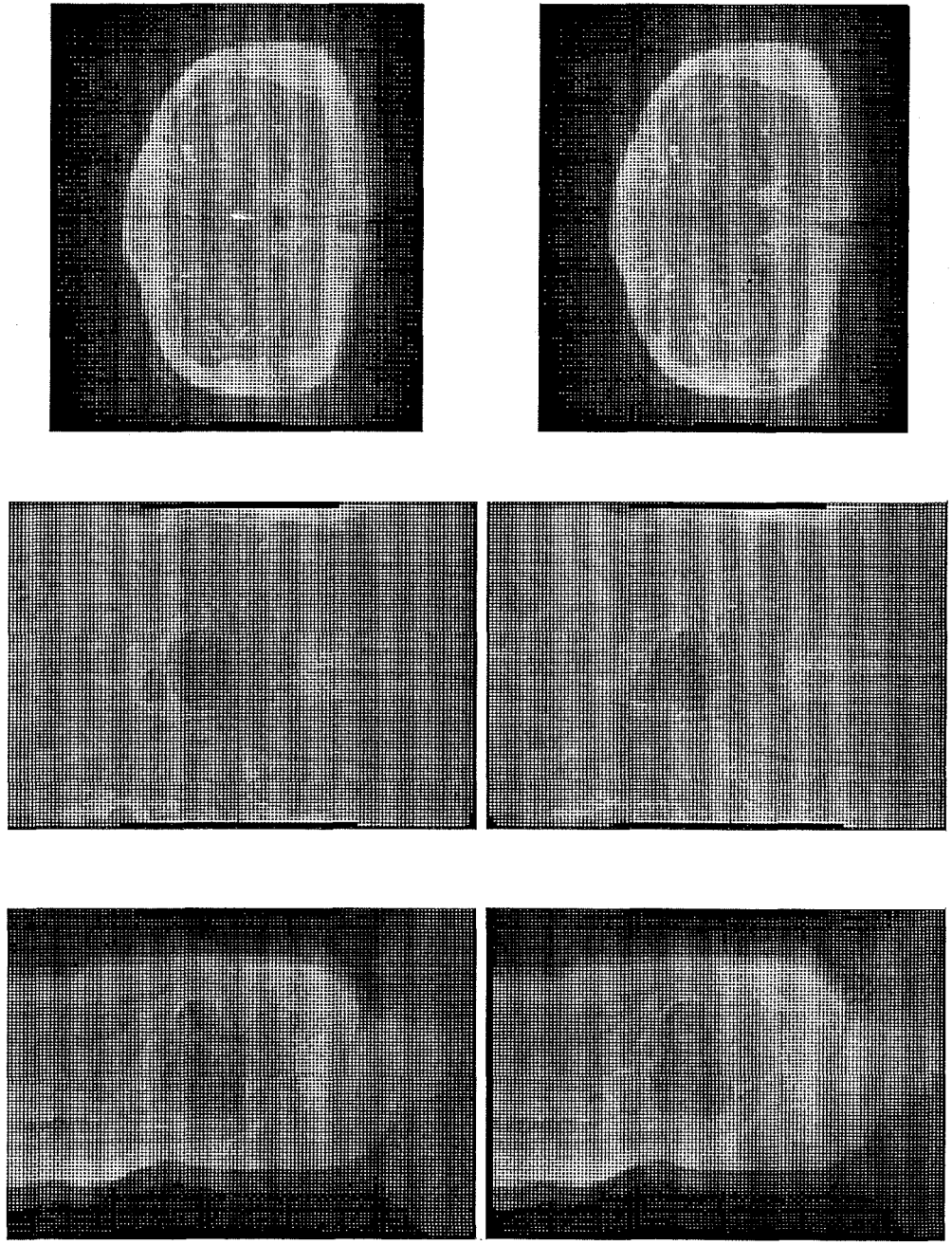
FIG. 17 shows example images demonstrating the correction of saturation banding artifacts using a two dimensional signal correction profile of the present disclosure.

FIGS. 15, 16, and 17 provide examples of saturation banding correction using a two dimensional signal correction profile on three orthogonal slices of pelvic images acquired using a segmented EPI sequence set to run in a fast spoiled steady state regime at a rate of 4 frames per second (corresponding to a total of 12 images per second). The correction is demonstrated for three different slice thicknesses.

FIG. 15 is an example of saturation band correction processed for 0.35 T MR of three orthogonal slices of the pelvic acquired at 4 frames per second (total of 12 images per second) using a segmented EPI in a fast steady state regime. Slice thickness and FOV are 7 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

FIG. 16 is an example of saturation band correction processed for 0.35 T MR of three orthogonal slices of the pelvic region acquired at 4 frames per second (total of 12 images per second) using a segmented EPI in a fast steady state regime. Slice thickness and FOV are 5 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

FIG. 17 is an example of saturation band correction processed for 0.35 T MR of three orthogonal slices of the pelvic region acquired at 4 frames per second (total of 12 images per second) using a segmented EPI in a fast steady state regime. Slice thickness and FOV are 3.5 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

Figure 18:
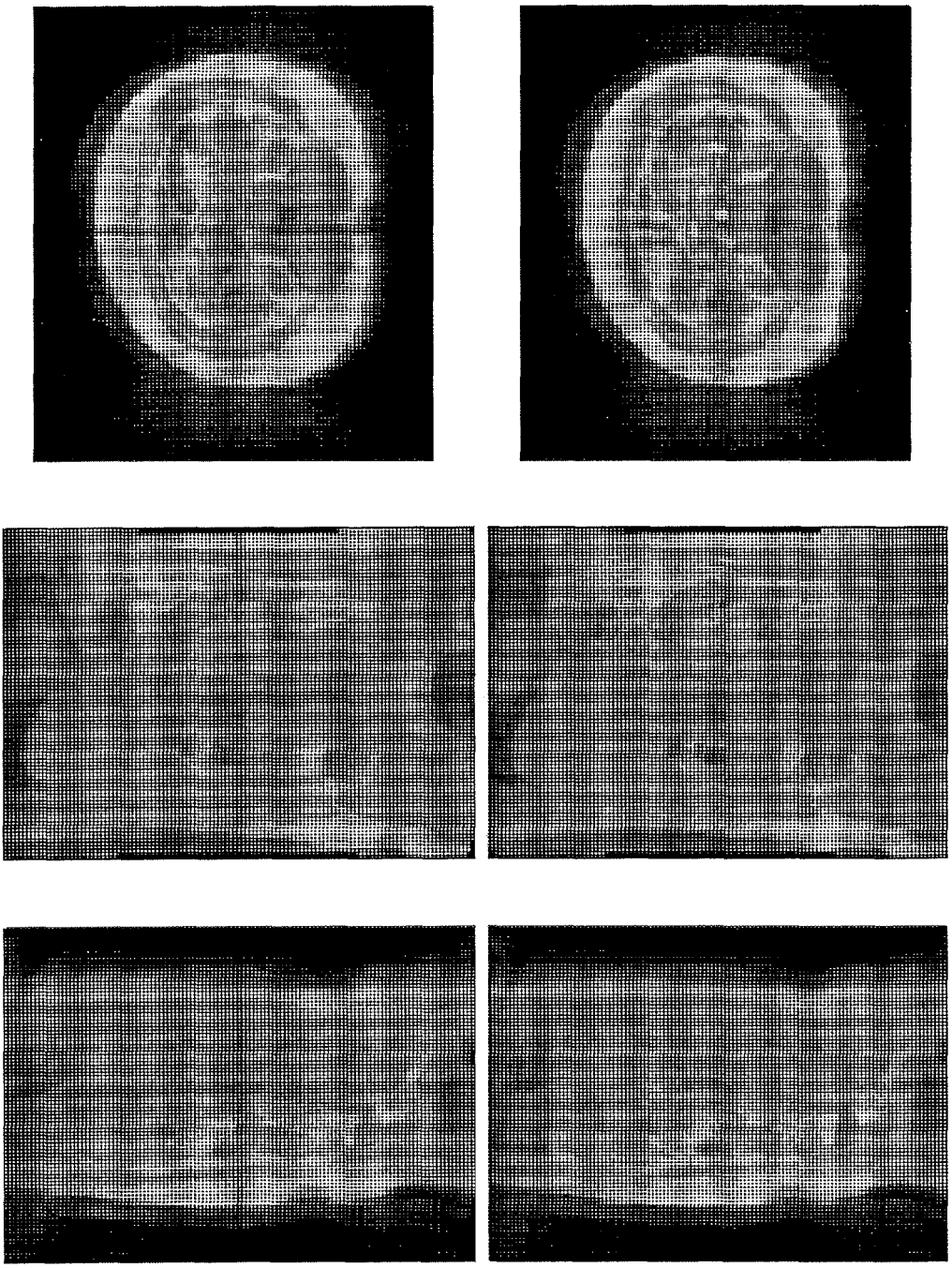
FIG. 18 shows example images demonstrating the correction of saturation banding artifacts using a two dimensional signal correction profile of the present disclosure.
Figure 19:
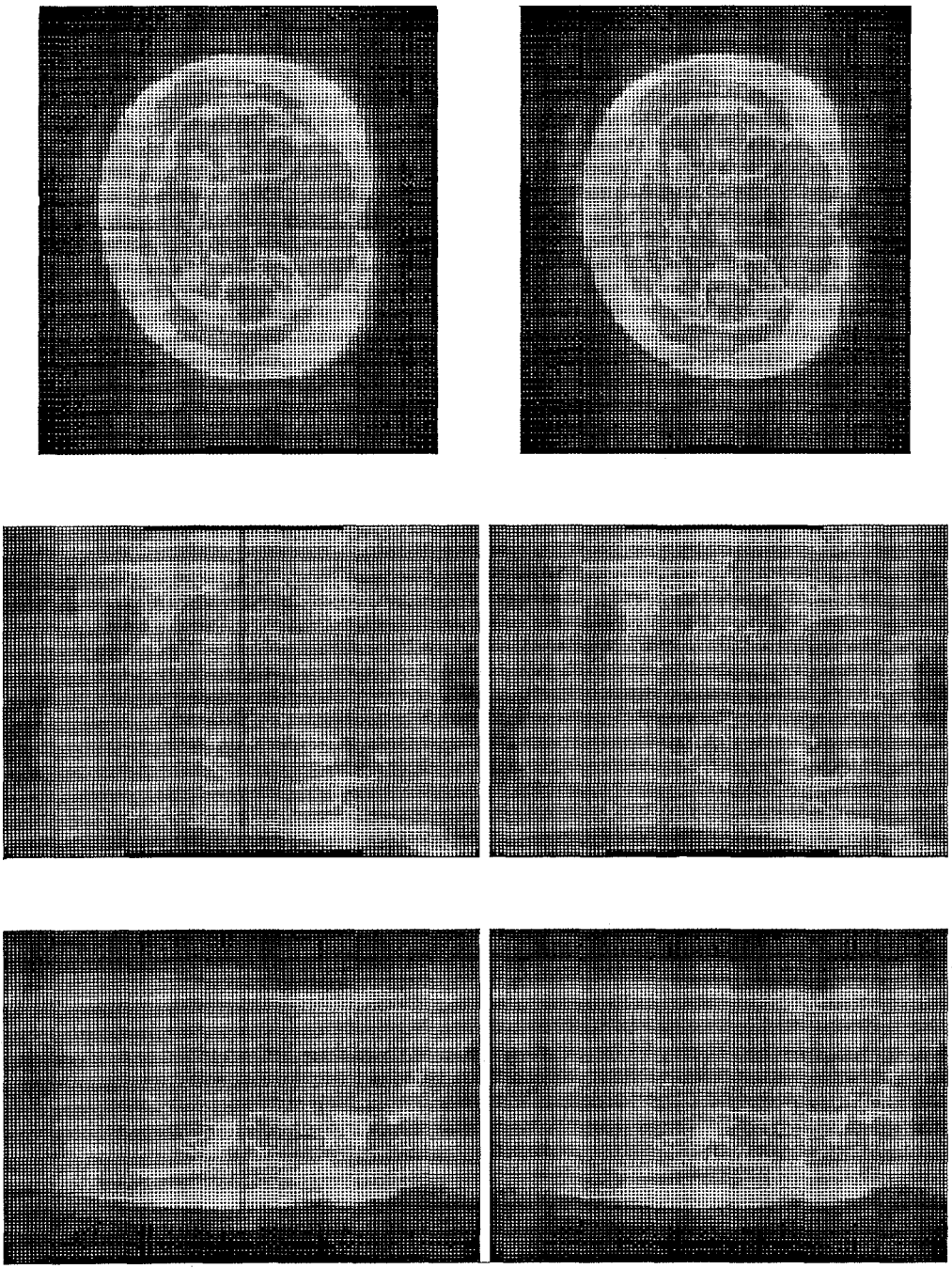
FIG. 19 shows example images demonstrating the correction of saturation banding artifacts using a two dimensional signal correction profile of the present disclosure.
Figure 20:
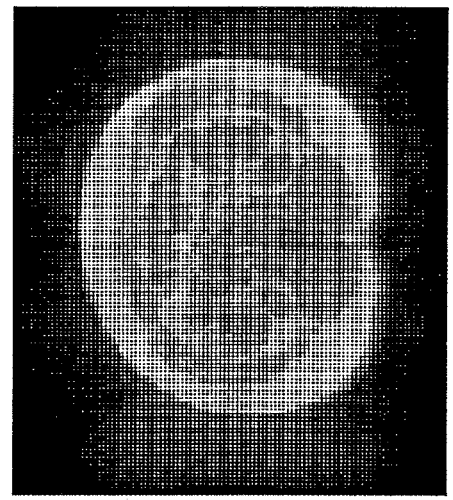
FIG. 20 shows example images demonstrating the correction of saturation banding artifacts using a two dimensional signal correction profile of the present disclosure.
Figure 20:
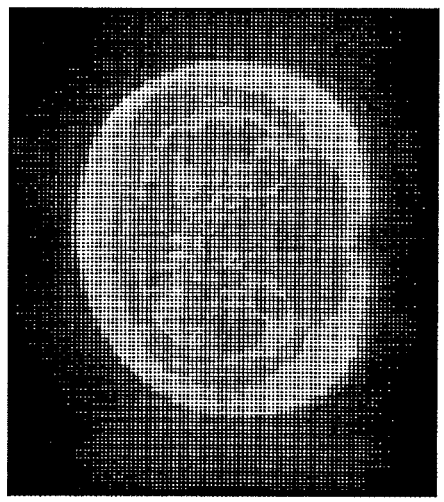
Figure 20:
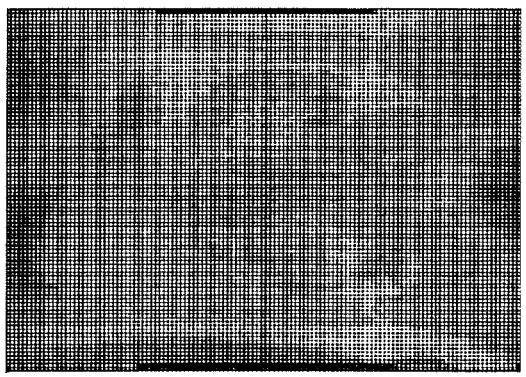
Figure 20:
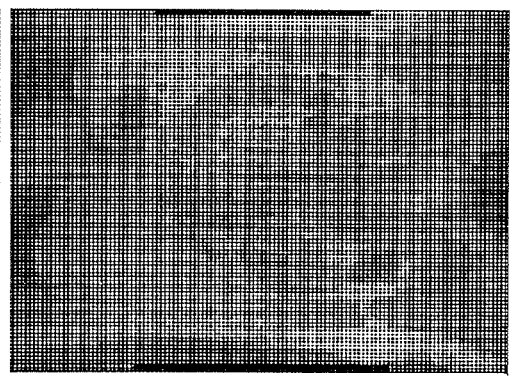
Figure 20:
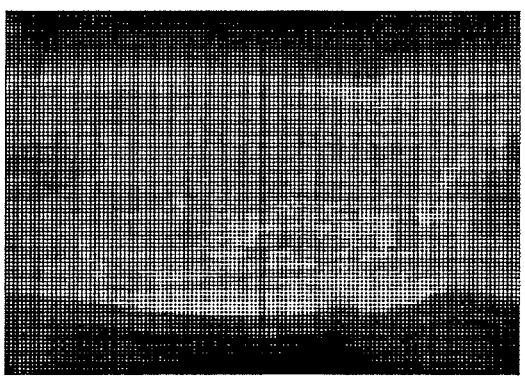
Figure 20:
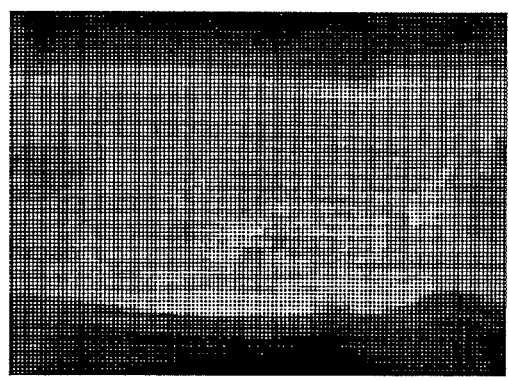

FIGS. 18, 19, and 20 provide examples of saturation banding correction using a two dimensional signal correction profile on three orthogonal slices of abdomen images acquired using a segmented EPI sequence set to run in a fast spoiled steady state regime at a rate of 4 frames per second (corresponding to a total of 12 images per second). The correction is demonstrated for three different slice thicknesses.

FIG. 18 is an example of saturation band correction processed for 0.35 T MR of three orthogonal slices of the abdomen acquired at 4 frames per second (total of 12 images per second) using a segmented EPI in a fast steady state regime. Slice thickness and FOV are 7 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

FIG. 19 is an example of saturation band correction processed for 0.35 T MR of three orthogonal slices of the abdomen acquired at 4 frames per second (total of 12 images per second) using a segmented EPI in a fast steady state regime. Slice thickness and FOV are 5 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

FIG. 20 is an example of saturation band correction processed for 0.35 T MR of three orthogonal slices of the abdomen acquired at 4 frames per second (total of 12 images per second) using a segmented EPI in a fast steady state regime. Slice thickness and FOV are 3.5 mm and 450×351 mm, respectively. The top row indicates images with saturation banding artifacts, and the bottom row indicates the corresponding images corrected using a two dimensional signal correction profile. Columns from left to right correspond to sagittal, coronal, and axial views, respectively.

Figure 21:
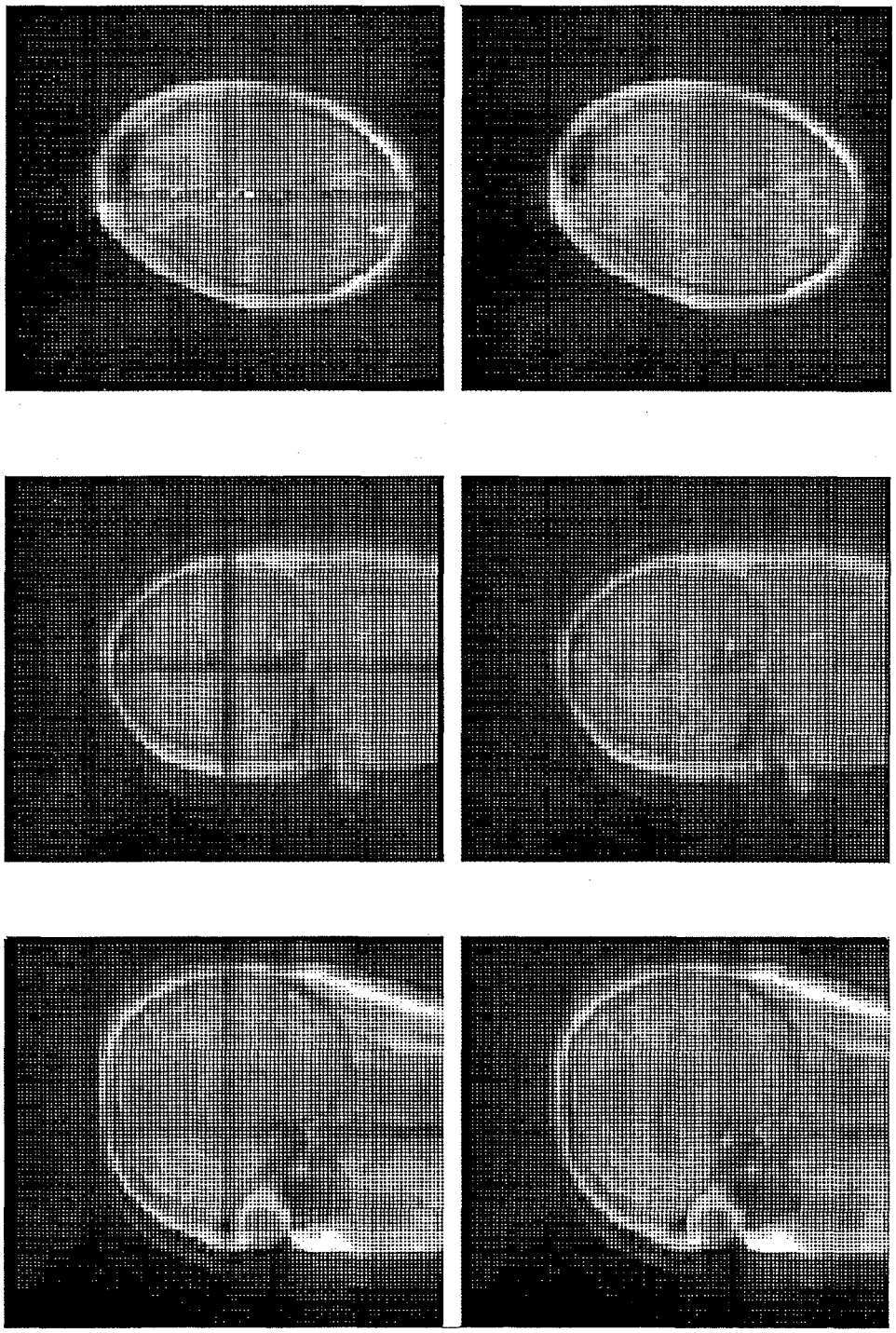
FIG. 21 shows example images demonstrating the correction of saturation banding artifacts using a two dimensional signal correction profile of the present disclosure.
Figure 22:
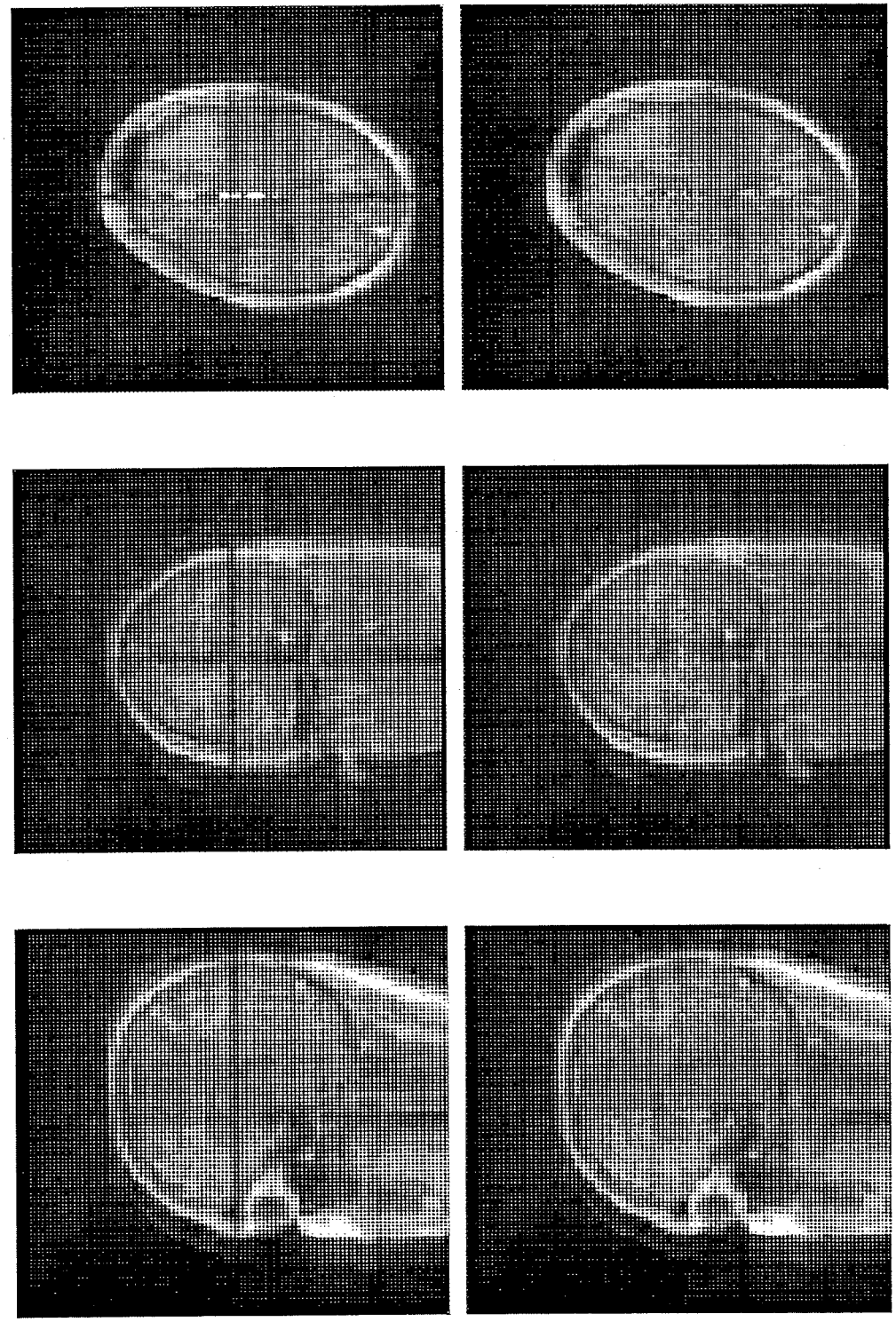
FIG. 22 shows example images demonstrating the correction of saturation banding artifacts using a two dimensional signal correction profile of the present disclosure.
Figure 23:
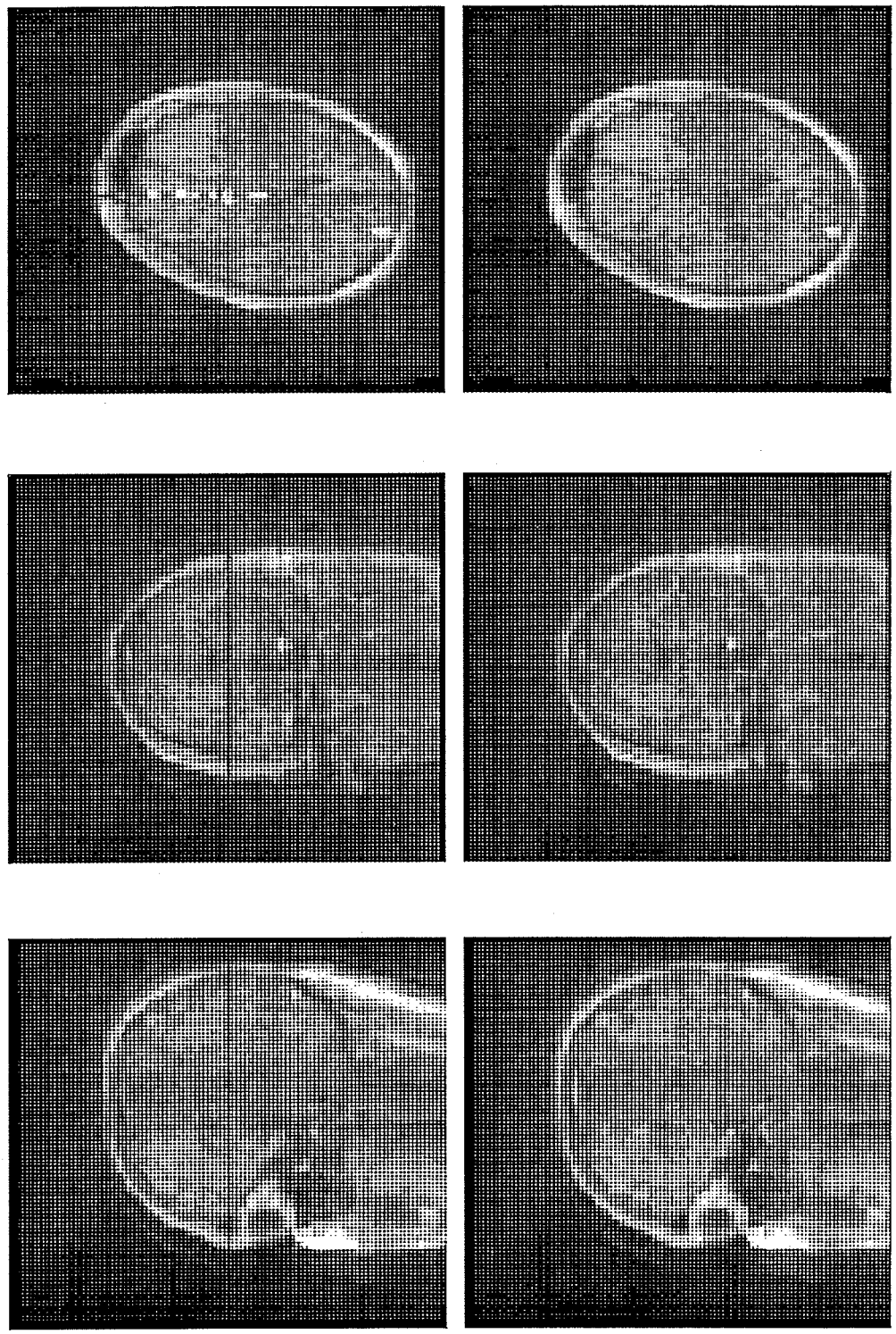
FIG. 23 shows example images demonstrating the correction of saturation banding artifacts using a two dimensional signal correction profile of the present disclosure.

FIGS. 21, 22, and 23 provide examples of saturation banding correction using a two dimensional signal correction profile on three orthogonal slices of head images acquired using a segmented EPI sequence set to run in a fast spoiled steady state regime at a rate of 4 frames per second (corresponding to a total of 12 images per second). The correction is demonstrated for three different slice thicknesses.

FIG. 21 is an example of saturation band correction processed for 0.35 T MR of three orthogonal slices of the head acquired at 4 frames per second (total of 12 images per second) using a segmented EPI in a fast steady state regime. Slice thickness and FOV are 7 mm and 270×270 mm, respectively. The top row indicates images with saturation banding artifacts, and the bottom row indicates the corresponding images corrected using a two dimensional signal correction profile. Columns from left to right correspond to sagittal, coronal, and axial views, respectively.

FIG. 22 is an example of saturation band correction processed for 0.35 T MR of three orthogonal slices of the head acquired at 4 frames per second (total of 12 images per second) using a segmented EPI in a fast steady state regime. Slice thickness and FOV are 5 mm and 270×270 mm, respectively. The top row indicates images with saturation banding artifacts, and the bottom row indicates the corresponding corrected using a two dimensional signal correction profile. Columns from left to right correspond to sagittal, coronal, and axial views, respectively.

FIG. 23 is an example of saturation band correction processed for 0.35 T MR of three orthogonal slices of the head acquired at 4 frames per second (total of 12 images per second) using a segmented EPI in a fast steady state regime. Slice thickness and FOV are 3.5 mm and 270×270 mm, respectively. The top row indicates images with saturation banding artifacts, and the bottom row indicates the corresponding images corrected using a two dimensional signal correction profile. Columns from left to right correspond to sagittal, coronal, and axial views, respectively.

Figure 24:
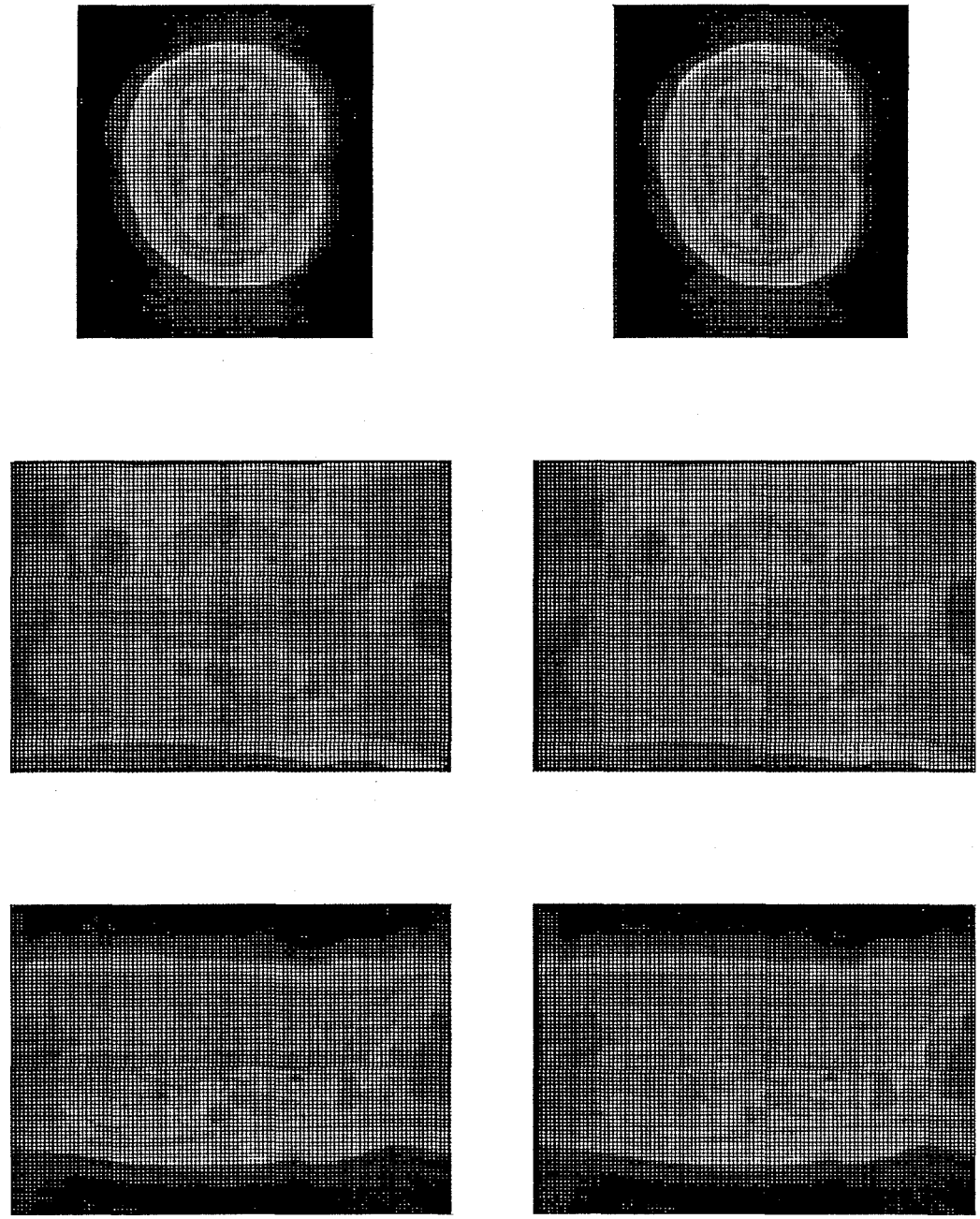
FIG. 24 shows example images demonstrating the correction of saturation banding artifacts using one dimensional signal correction profiles of the present disclosure.
Figure 25:
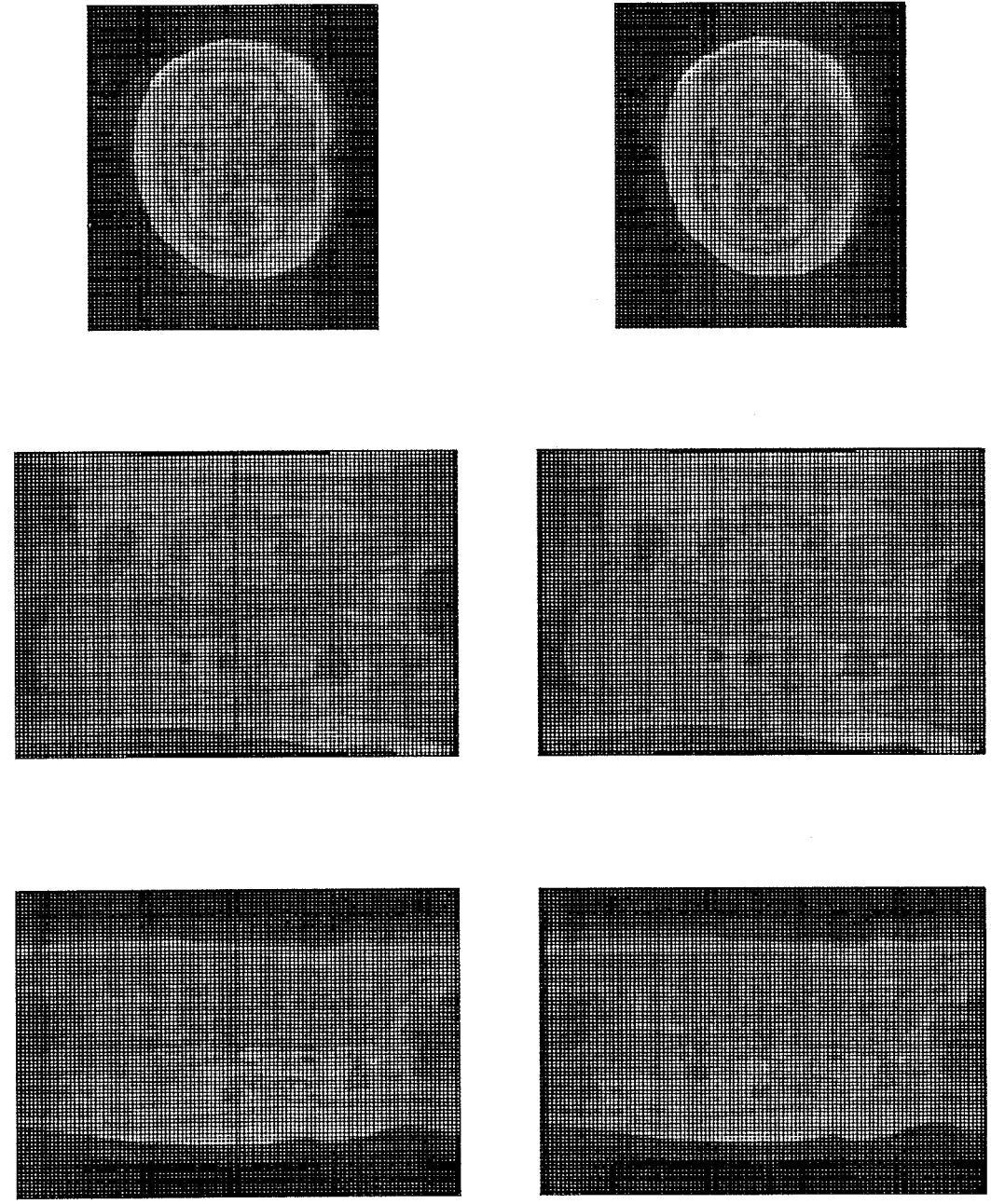
FIG. 25 shows example images demonstrating the correction of saturation banding artifacts using one dimensional signal correction profiles of the present disclosure.
Figure 26:
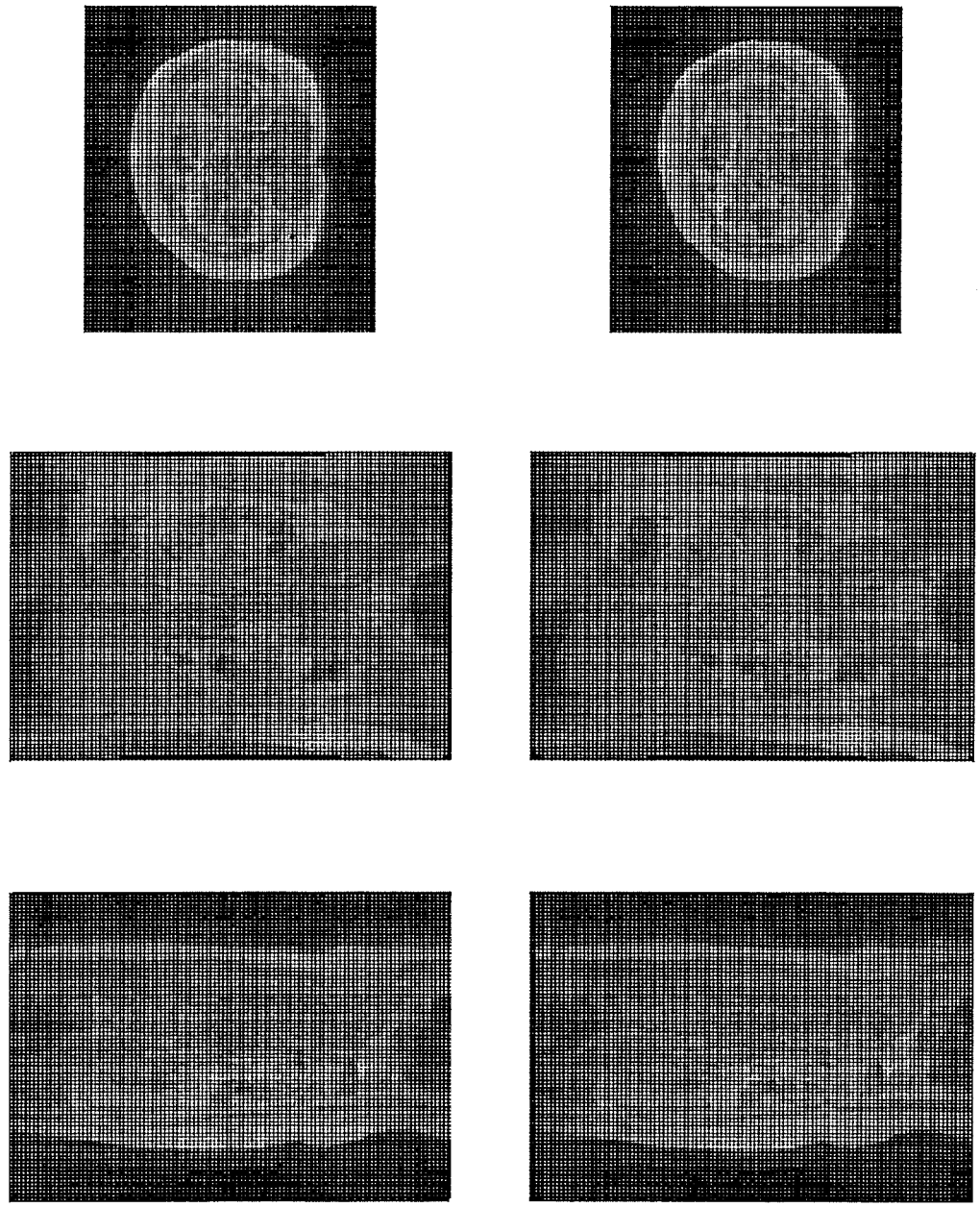
FIG. 26 shows example images demonstrating the correction of saturation banding artifacts using one dimensional signal correction profiles of the present disclosure.

FIGS. 24, 25, and 26 provide examples of saturation banding correction using a one dimensional signal correction profile on three orthogonal slices of abdomen images using a segmented EPI sequence set to run in a fast spoiled steady state regime at a rate of 4 frames per second (corresponding to a total of 12 images per second). The correction is demonstrated for three different slice thicknesses.

FIG. 24 is an example of saturation band correction processed for 0.35 T MR of three orthogonal slices of the abdomen acquired at 4 frames per second (total of 12 images per second) using a segmented EPI in a fast steady state regime. Slice thickness and FOV are 7 mm and 450×351 mm, respectively. The top row indicates images with saturation banding artifacts, and the bottom row indicates the corresponding images corrected using one dimensional signal correction profiles. Columns from left to right correspond to sagittal, coronal, and axial views, respectively.

FIG. 25 is an example of saturation band correction processed for 0.35 T MR of three orthogonal slices of the abdomen acquired at 4 frames per second (total of 12 images per second) using a segmented EPI in a fast steady state regime. Slice thickness and FOV are 5 mm and 450×351 mm, respectively. The top row indicates images with saturation banding artifacts, and the bottom row indicates the corresponding images corrected using one dimensional signal correction profiles. Columns from left to right correspond to sagittal, coronal, and axial views, respectively.

FIG. 26 is an example of saturation band correction processed for 0.35 T MR of three orthogonal slices of the pelvic region acquired at 4 frames per second (total of 12 images per second) using a segmented EPI in a fast steady state regime. Slice thickness and FOV are 5 mm and 450×351 mm, respectively. The top row indicates images with saturation banding artifacts, and the bottom row indicates the corresponding images corrected using one dimensional signal correction profiles. Columns from left to right correspond to sagittal, coronal, and axial views, respectively.

Figure 27:
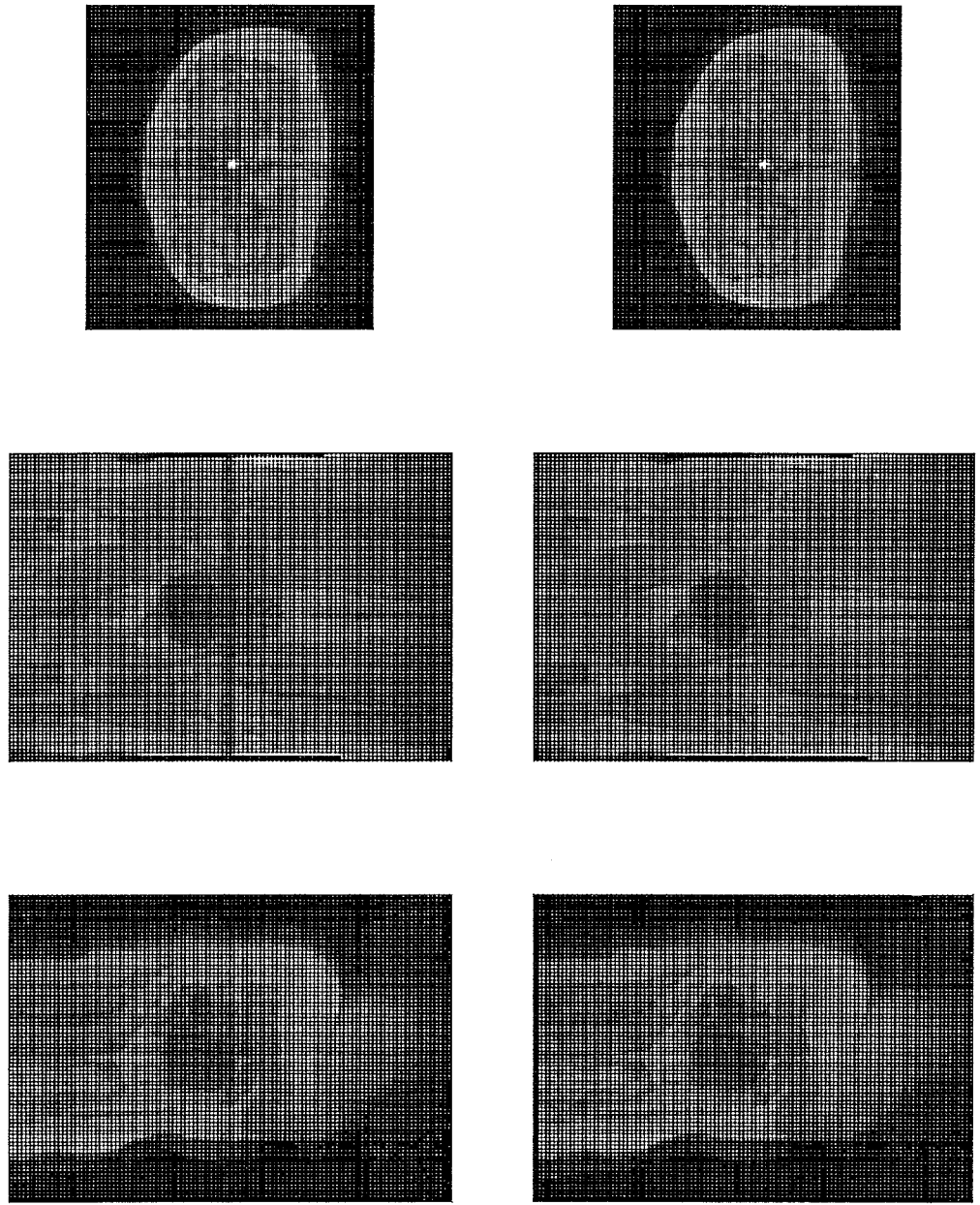
FIG. 27 shows example images demonstrating the correction of saturation banding artifacts using one dimensional signal correction profiles of the present disclosure.
Figure 28:
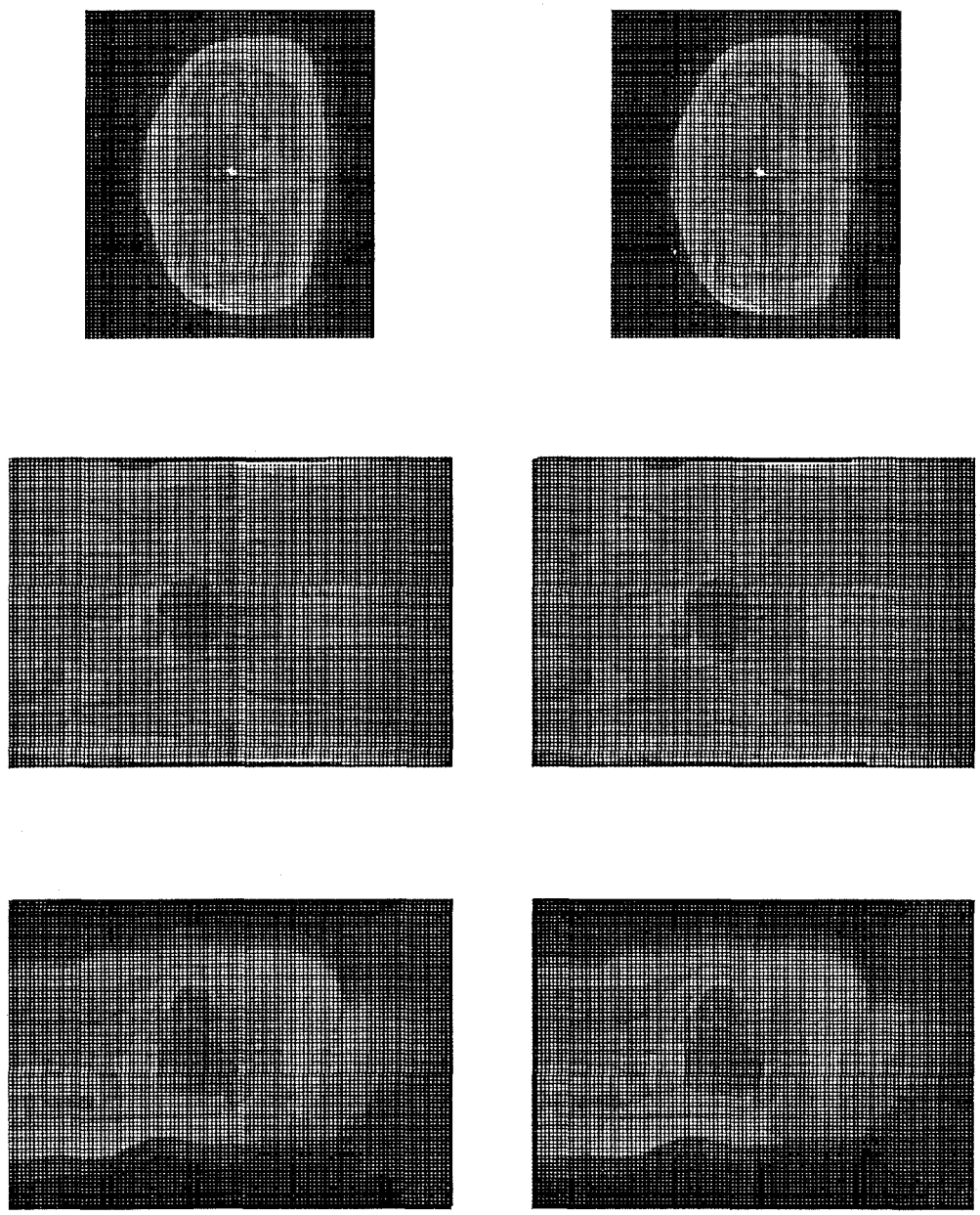
FIG. 28 shows example images demonstrating the correction of saturation banding artifacts using one dimensional signal correction profiles of the present disclosure.
Figure 29:
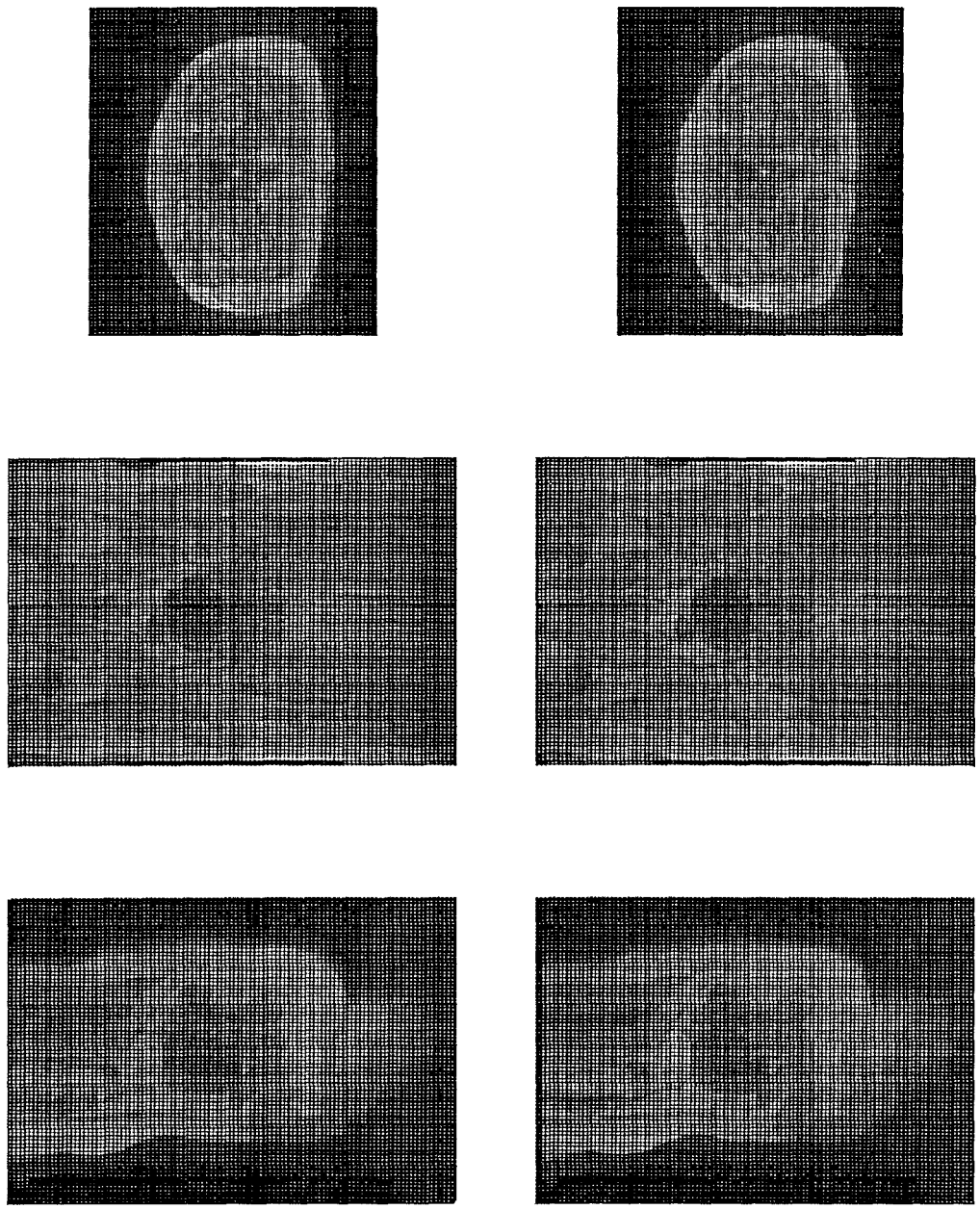
FIG. 29 shows example images demonstrating the correction of saturation banding artifacts using one dimensional signal correction profiles of the present disclosure.

FIGS. 27, 28 and 29 provide examples of saturation banding correction using a one dimensional signal correction profile on three orthogonal slices of pelvic images using a segmented EPI sequence set to run in a fast spoiled steady state regime at a rate of 4 frames per second (corresponding to a total of 12 images per second). The correction is demonstrated for three different slice thicknesses.

FIG. 27 is an example of saturation band correction processed for 0.35 T MR of three orthogonal slices of the pelvic region acquired at 4 frames per second (total of 12 images per second) using a segmented EPI in a fast steady state regime. Slice thickness and FOV are 5 mm and 450×351 mm, respectively. The top row indicates images with saturation banding artifacts, and the bottom row indicates the corresponding images corrected using one dimensional signal correction profiles. Columns from left to right correspond to sagittal, coronal, and axial views, respectively.

FIG. 28 is an example of saturation band correction processed for 0.35 T MR of three orthogonal slices of the pelvic region acquired at 4 frames per second (total of 12 images per second) using a segmented EPI in a fast spoiled steady state regime. Slice thickness and FOV are 3.5 mm and 450×351 mm, respectively. The top row indicates images with saturation banding artifacts, and the bottom row indicates the corresponding images corrected using one dimensional signal correction profiles. Columns from left to right correspond to sagittal, coronal, and axial views, respectively.

FIG. 29 is an example of saturation band correction processed for 0.35 T MR of three orthogonal slices of the pelvic region acquired at 4 frames per second (total of 12 images per second) using a segmented EPI in a fast spoiled steady state regime. Slice thickness and FOV are 3.5 mm and 450×351 mm, respectively. The top row indicates images with saturation banding artifacts and the bottom row indicates the corresponding images corrected using one dimensional signal correction profiles. Columns from left to right correspond to sagittal, coronal, and axial views, respectively.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. The present disclosure contemplates that the calculations disclosed in the embodiments herein may be performed in a number of ways, applying the same concepts taught herein, and that such calculations are equivalent to the embodiments disclosed. Furthermore, the above described advantages are not intended to limit the application of any issued claims to processes and structures accomplishing any or all of the advantages.

Additionally, section headings shall not limit or characterize the invention(s) set out in any claims that may issue from this disclosure. Specifically, and by way of example, although the headings refer to a "Technical Field," such claims should not be limited by the language chosen under this heading to describe the so-called technical field. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. A method for correcting saturation banding in magnetic resonance imaging comprising:
   acquiring at least one artifact calibration scan, with a timing that corresponds to that of an actual diagnostic imaging scan;
   acquiring at least one reference calibration scan, with a timing that corresponds to that of the actual diagnostic imaging scan;
   determining a mask of saturation bands in the at least one artifact calibration scan;
   dividing each voxel in the at least one reference calibration scan by each corresponding voxel in the at least one artifact calibration scan within the extent of the mask to determine mask region correction values;
   assigning the mask region correction values to corresponding voxels in a two dimensional signal correction profile, the corresponding voxels being within the extent of the mask, and
   assigning a preselected constant value to a plurality of voxels in the two dimensional signal correction profile, the plurality of voxels being outside of the extent of the mask;
   applying the two dimensional signal correction profile to the actual diagnostic imaging scan.

2. The method of claim 1, wherein applying the two dimensional signal correction profile comprises
   multiplying each of the voxels in the actual diagnostic imaging scan by a corresponding value in the two dimensional signal correction profile to obtain a corrected diagnostic image.

3. The method of claim 1, wherein determining the mask of saturation bands includes using a segmentation algorithm on the at least one artifact calibration scan.

4. The method of claim 1, wherein determining the mask of saturation bands includes determining locations of saturation bands using information on the physical locations of the acquired slices and using a band thickness of at least the thickness of a slice.

5. The method of claim 4, wherein the band thickness is at least 4 times the slice thickness.

6. The method of claim 1, wherein a plurality of artifact calibration scans and a plurality of reference calibration scans are acquired and wherein dividing each voxel in the at least one reference calibration scan by each corresponding voxel in the at least one artifact calibration scan comprises dividing an average of the voxels in the plurality of artifact calibration scans by an average of the corresponding voxels in the plurality of reference calibration scans.

7. The method of claim 1, further comprising normalizing the at least one artifact calibration scan with a mean intensity of the at least one artifact calibration scan and normalizing the at least one reference calibration scan with a mean intensity of the at least one reference calibration scan.

8. The method of claim 1, wherein the preselected constant value is substantially equal to one.

9. The method of claim 2, wherein the acquiring at least one artifact calibration scan and the acquiring at least one reference calibration scan are performed by an MRI scanner and wherein the corrected diagnostic image is output to a display.

10. A method for correcting saturation banding in magnetic resonance imaging comprising:
    acquiring at least one artifact calibration scan, with a timing that corresponds to that of an actual diagnostic imaging scan;
    acquiring at least one reference calibration scan, with a timing that corresponds to that of the actual diagnostic imaging scan;
    determining a mask of saturation bands in the at least one artifact calibration scan;
    dividing each voxel in the at least one reference calibration scan by each corresponding voxel in the at least one artifact calibration scan within the extent of the mask to determine mask region correction values;
    assigning the mask region correction values to corresponding voxels in a two dimensional signal correction profile, the corresponding voxels being within the extent of the mask, and
    applying the two dimensional signal correction profile to the actual diagnostic imaging scan.

11. The method of claim 10, wherein applying the two dimensional signal correction profile comprises multiplying each of the voxels in a mask region of the actual diagnostic imaging scan by a corresponding value in the two dimensional signal correction profile to obtain a corrected diagnostic image.

12. The method of claim 11, wherein the acquiring at least one artifact calibration scan and the acquiring at least one reference calibration scan are performed by an MRI scanner and wherein the corrected diagnostic image is output to a display.

13. A method for correcting saturation banding in magnetic resonance imaging comprising:
    acquiring a plurality of artifact calibration scans, with a timing that corresponds to that of an actual diagnostic imaging scan, the plurality of artifact calibration scans each comprising a plurality voxels;
    acquiring a plurality of reference calibration scans, with a timing that corresponds to that of the actual diagnostic imaging scan, the plurality of reference calibration scans each comprising a plurality of voxels;
    creating an average artifact calibration scan by averaging the value of each voxel across the plurality of artifact calibration scans;
    creating an average reference calibration scan by averaging the value of each voxel across the plurality of reference calibration scans;
    dividing each voxel of the average reference calibration scan by each corresponding voxel of the average artifact calibration scan to create a two dimensional signal correction profile; and
    applying the two dimensional signal correction profile to the actual diagnostic imaging scan.

14. The method of claim 13, wherein applying the two dimension signal correction profile comprises
    multiplying each of the voxels in the actual diagnostic imaging scan by a corresponding value in the two dimensional signal correction profile to obtain a corrected diagnostic image.

15. The method of claim 14, wherein the acquiring a plurality of artifact calibration scans and the acquiring a plurality of reference calibration scans are performed by an MRI scanner and wherein the corrected diagnostic image is output to a display.

\* \* \* \* \*